United States Patent [19]
Richards et al.

[11] Patent Number: 5,904,496
[45] Date of Patent: May 18, 1999

[54] WAFER FABRICATION OF INSIDE-WRAPPED CONTACTS FOR ELECTRONIC DEVICES

[75] Inventors: John G. Richards, San Jose; Donald P. Richmond, III, Palo Alto; Wendell B. Sander, Los Gatos, all of Calif.

[73] Assignee: Chipscale, Inc., San Jose, Calif.

[21] Appl. No.: 08/788,764

[22] Filed: Jan. 24, 1997

[51] Int. Cl.⁶ .......................... H01L 21/44; H01L 21/48; H01L 21/50

[52] U.S. Cl. .......................... 438/106; 438/118; 438/124; 438/462; 438/613

[58] Field of Search .................................. 438/106, 118, 438/124, 462, 613

[56] References Cited

U.S. PATENT DOCUMENTS

| | | | |
|---|---|---|---|
| 4,783,695 | 11/1988 | Eichelberger et al. | 357/65 |
| 4,835,704 | 5/1989 | Eichelberger et al. | 364/490 |
| 4,931,410 | 6/1990 | Tokunaga et al. | 438/613 |
| 5,071,792 | 12/1991 | Van Vonno et al. | 438/484 |
| 5,161,093 | 11/1992 | Gorczyca et al. | 361/414 |
| 5,353,498 | 10/1994 | Fillion et al. | 438/118 |
| 5,407,864 | 4/1995 | Kim | 438/118 |
| 5,434,745 | 7/1995 | Shokrgozar et al. | 438/119 |
| 5,521,420 | 5/1996 | Richards et al. | 257/735 |
| 5,557,149 | 9/1996 | Richards et al. | 257/779 |
| 5,559,362 | 9/1996 | Narita | 438/462 |
| 5,595,935 | 1/1997 | Chan et al. | 438/4 |
| 5,639,694 | 6/1997 | Diffenderfer et al. | 438/124 |

FOREIGN PATENT DOCUMENTS

WO 95/34083  12/1995  WIPO .

OTHER PUBLICATIONS

PCT International Search Report.
"Joint Industry Standard Implementation of Flip Chip and Chip Scale Technology," The Institute for Interconnecting and Packaging Electronic Circuits (Jan. 1996).

*Primary Examiner*—Kevin M. Picardat
*Assistant Examiner*—Deven Collins
*Attorney, Agent, or Firm*—Blakely, Sokoloff, Taylor & Zafman LLP

[57] ABSTRACT

A packaging technique for electronic devices includes wafer fabrication of contacts that wrap down the inside surface of a substrate post. Inherently reliable contacts suitable for a variety of devices can be formed, via a simple fabrication process, with good wafer packing density. A trench is formed in the top surface of a substrate parallel to the edge of its electronic circuit. A gold beam wire extends from a connection point within the circuit into the trench. Unless an insulative substrate is used, the wire runs over an insulating layer that ends part way through the trench. After epoxy encapsulating the top of the substrate, it is back planed to form the bottom surface of the post. Then it is selectively back etched, to expose the bottom surface of the wire, to form the inside surface of the post, and to form the bottom surface of the finished device. A solderable lead wire runs from the exposed gold wire, down the inside surface of the post, and across its bottom. Sawing forms the outside surface of the post and completes the finished device without subsequent assembly. Alternatively, no post is used and the contact comprises an encapsulant protrusion, similarly formed in a silicon trench that is subsequently etched away. Gold wires run under the protrusion and may be covered by solderable metal, or a dense gold compression bond may be used. Optionally, the bottom of the finished device drops down to be co-planar with the contact bottoms, so as to conduct heat out of the device.

24 Claims, 22 Drawing Sheets

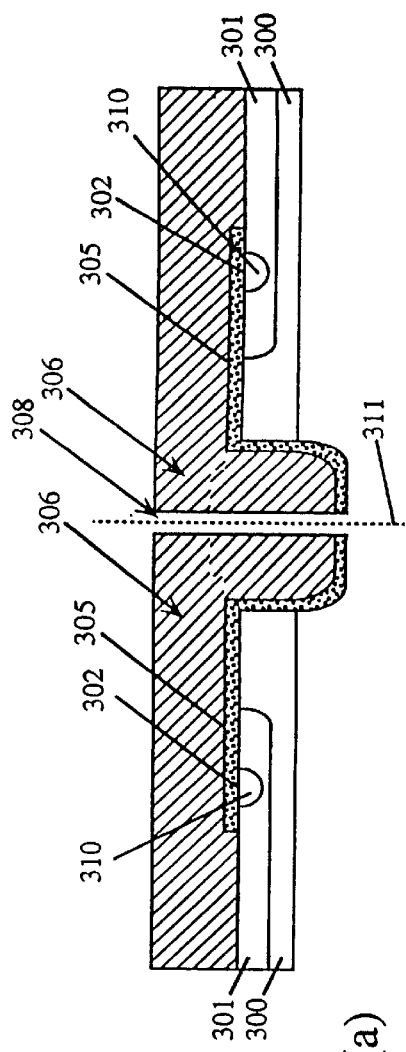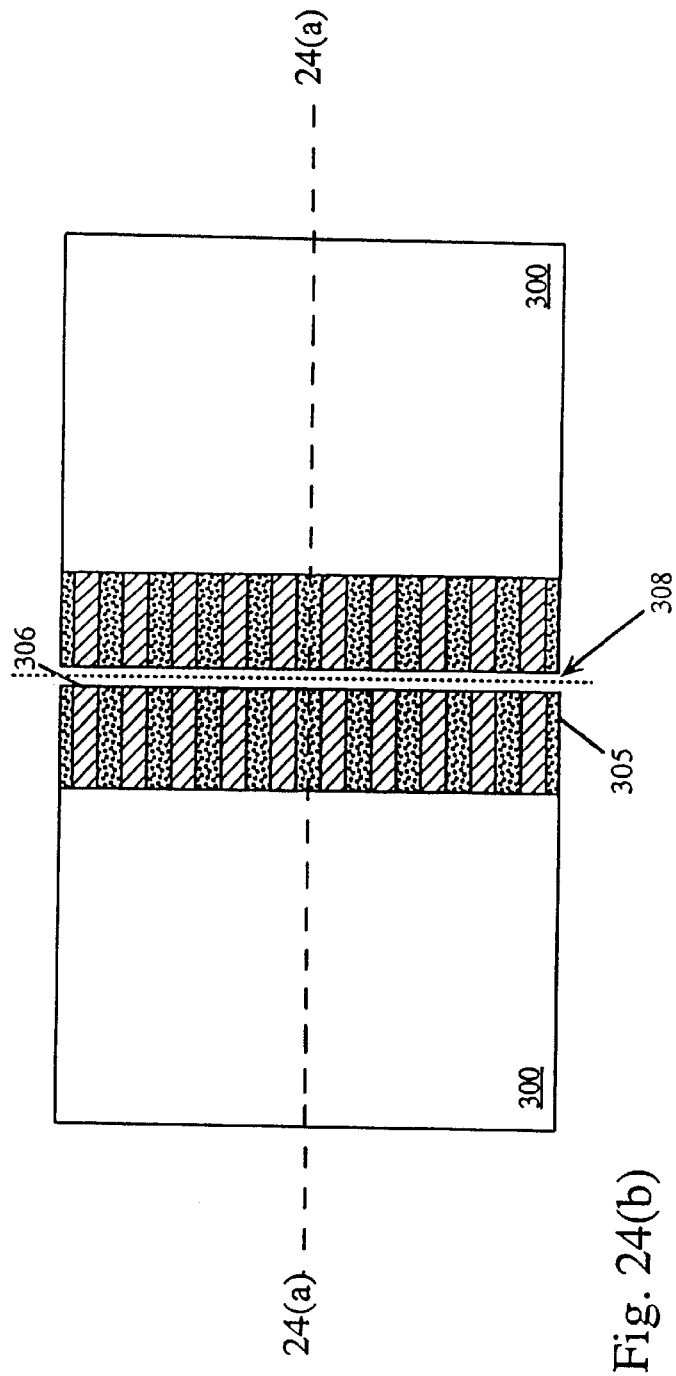
Fig. 24(a)
Fig. 24(b)

WAFER FABRICATION OF INSIDE-WRAPPED CONTACTS FOR ELECTRONIC DEVICES

FIELD OF THE INVENTION

The present invention relates generally to the field of electronic device packaging and fabrication. More particularly, the present invention relates to improved contacts for semiconductors, integrated circuits and other electronic circuits and discrete electronic components.

BACKGROUND OF THE INVENTION

The package of any electronic device must include contacts for electrically connecting signals, power and ground between the internals of the device and external circuitry. Simple examples of prior-art contacts are the wire leads that protrude from each end of a discrete diode or resistor, or the metal caps on each end of a fuse.

A sophisticated electronic device, such as a microprocessor, may require several hundred contacts. For such devices, surface mount techniques are typically used. The leads of a surface mount device simply contact wires or conductors on the surface of the circuit board, for example, the motherboard of a personal computer system, to which the device is attached. Surface mount leads do not penetrate through the circuit board like a diode or resistor lead typically does, nor do they require a socket as a fuse does. Soldering is typically used to both electronic and mechanically connect surface mount leads to the circuit board.

FIG. 1 illustrates a prior-art integrated circuit that is surface mounted over a circuit board. This integrated circuit includes a silicon (Si) circuit 101. Insulating film 102 coats the underside of silicon circuit 101 to protect and passivate it. Epoxy layer 103 and a silicon cap 104 cover silicon circuit 101. Epoxy layer 103 and silicon cap 104 also cover metal bridge 105.

Metal bridge 105 electrically connects silicon circuit 101 to silicon post 106. Epoxy section 111 mechanically secures silicon circuit 101, metal bridge 105 and silicon post 106. Nickel (Ni) plate 107 covers silicon post 106 and forms a butt-joint with metal bridge 105. Nickel plate 107 is electrically coupled to silicon post 106 and metal bridge 105. Nickel plate 107 provides the integrated circuit with a connection point to external circuitry.

This prior-art contact comprises:
1) metal bridge 105,
2) silicon post 106,
3) nickel plate 107, and
4) epoxy section 111.

As illustrated in FIG. 1, the contact of the integrated circuit has been soldered to circuit board conductor 109 with solder fillet 108. Circuit board conductor 109 has been formed over circuit board substrate 110.

The contact for the integrated circuit illustrated in FIG. 1 provides for various advantages. For example, nickel plate 107 covers the sidewalls of silicon post 106, which helps to strengthen the bonding between the integrated circuit and the circuit board. This is due to the fact that solder can be placed on nickel plate 107 on the sidewalls of silicon post 106 as illustrated in FIG. 1. It also facilitates inspection during surface mount of the integrated circuit to the circuit board. Whether a good mount is made can be easily confirmed by looking at the solder on the sidewalls of silicon post 106.

Furthermore, nickel plate 107 extends over the sidewalls of silicon post 106 and contacts the side of metal bridge 105, forming a butt-joint interface between nickel plate 107 and metal bridge 105. This provides for an electrical contact between circuit board conductor 109 and silicon circuit 101.

The butt-joint interface of the integrated circuit contact of FIG. 1, however, cannot be formed with much certainty or control over its resulting reliability or bonding adhesion between nickel plate 107 and metal bridge 105. There are a number of reasons for this. The physical surface of the side of metal bridge 105 might not be flat enough to ensure a reliable bond at this butt-joint interface. Furthermore, the side of metal bridge 105 is difficult to clean because of its location on the side of the wafer. The bond at this butt-joint interface therefore might be weakened if the side of metal bridge 105 is not flat or has not been thoroughly cleaned.

The formation of this butt-joint interface also limits the materials that can be used for nickel plate 107 and metal bridge 105. This is so because metal bridge 105 and nickel plate 107 can comprise more than one metal layer. The bonding layer of nickel plate 107 then has to be formed so as to bond with each metal layer at the side of metal bridge 105 in order to form an effective contact. Accordingly, the selection of materials that can be used for metal bridge 105 and for the bonding layer of nickel plate 107 is limited.

FIG. 2 shows a prior-art contact that avoids a butt-joint by using a wrap-around flange contact. Silicon circuit 101, insulating film 102, epoxy layer 103, silicon cap 104, metal bridge 105, silicon post 106, solder filet 108, circuit board conductor 109, circuit board substrate 110, and epoxy section 111 are similar to that of the above described butt-joint contact. However, nickel plate 107 and metal bridge 105 have a horizontal flange interface 113. While the wrap around flange avoids the problems associated with a butt-joint, it is still a relatively complex design, requiring a relatively complex series of processing steps and a relatively large amount of wafer area dedicated to contact fabrication.

SUMMARY AND OBJECTS OF THE INVENTION

An object of the present invention is to simplify the process of fabricating contacts for electronic devices.

Another object is to increase the simplicity and the reliability of contacts for electronic devices.

A further object is to increase the wafer packing density of an electronic circuit by reducing the substrate area that is used for fabricating the device's contacts.

Another object is to provide contacts that have physical and electronic properties applicable to varied types of electronic devices.

Accordingly, a contact for an electronic device is described that comprises a substrate post and a lower wire that runs down the inside surface of the post to connect with an upper wire where not covered by the bottom surface of the substrate.

Such a contact is fabricated by forming a trench in the top surface of a substrate. The trench may be located near the edge of an electronic circuit or discrete component formed using or attached to the substrate. Optionally, an insulation layer is formed that has a through hole at a connection point within the circuit or component, and that ends part way through the trench. An upper wire is formed that runs from the connection point into the trench. The top of the substrate is encapsulated, thus forming an encapsulant protrusion in the trench.

The substrate is selectively thinned from the bottom, thus forming the bottom surface of a substrate post that is located near the trench, exposing part of the bottom surface of the upper wire and forming the inside surface of the substrate post. Optionally, the thinning of the substrate's bottom surface leaves a portion of the bottom surface of the substrate substantially co-planar with the bottom of the contacts.

A lower wire is formed that runs on the bottom of the substrate from the exposed portion of the upper wire, down the inside surface of the substrate post, and optionally across its bottom surface. Optionally, the surfaces of the substrate post between adjacent posts are defined by sawing or etching. Finally, the wafer is diced, thus forming the outside surface of the substrate post.

Alternatively, no post is used. Rather, the contact comprises a wire running over encapsulant that protrudes from the bottom surface of the substrate. The encapsulant protrusion is formed in a substrate trench that is subsequently removed by bottom thinning. Optionally, the bottom surface of the wire on the substrate protrusion can be covered by a contact layer. Optionally, the wire can be insulated from the substrate by an insulation layer. Optionally, the thinning of the substrate's bottom surface leaves a portion of the bottom surface of the substrate substantially co-planar with the bottom of the contacts.

Other objects, features, and advantages of the present invention will be apparent from the accompanying drawings and from the detailed description below.

BRIEF DESCRIPTION OF THE DRAWINGS

The present invention is illustrated by way of example and not limitation in the figures of the accompanying drawings in which like references indicate similar elements, and in which:

FIG. 24(a) illustrates a cross-sectional side view of two electronic devices and contacts comparable to those of the FIG. 22, but made using a gallium arsenide substrate wafer for which no insulator is necessary.

FIG. 24(b) shows a partial bottom view of the same two electronic devices, each with multiple contacts in a row along each edge.

DETAILED DESCRIPTION

The present invention encompasses embodiments or types of contacts for electrical or electronic devices that include a contact layer or wire that is wrapped down the inside surface of a substrate post, as well as embodiments in which there is no substrate post, rather there is a wire that runs over an encapsulant protrusion. Some encapsulant protrusion embodiments have a contact layer that covers the bottom surface of the wire and some do not. Some embodiments use insulative substrates and some use conductive substrates. Some embodiments use a drop bottom, in which the substrate extends down to the circuit board to which the device is attached so as to transfer heat thereto.

Inside-Wrapped Contacts with a Substrate Post

Figure 3A:
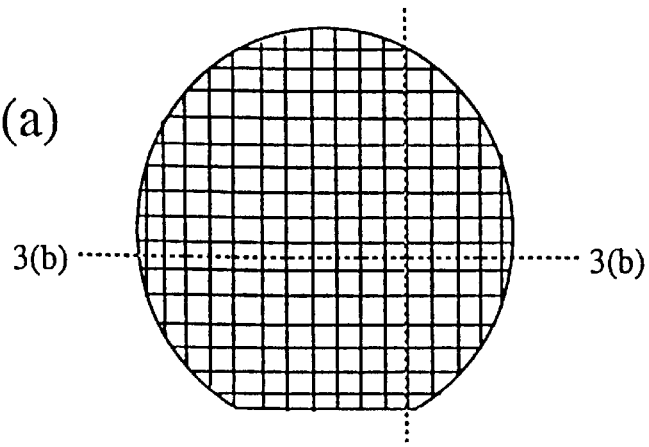
FIG. 3(a) shows a top view of a substrate wafer showing how its top surface is tiled with replications of circuits or components, each of which will be packaged to form an electronic device.
Figure 3B:
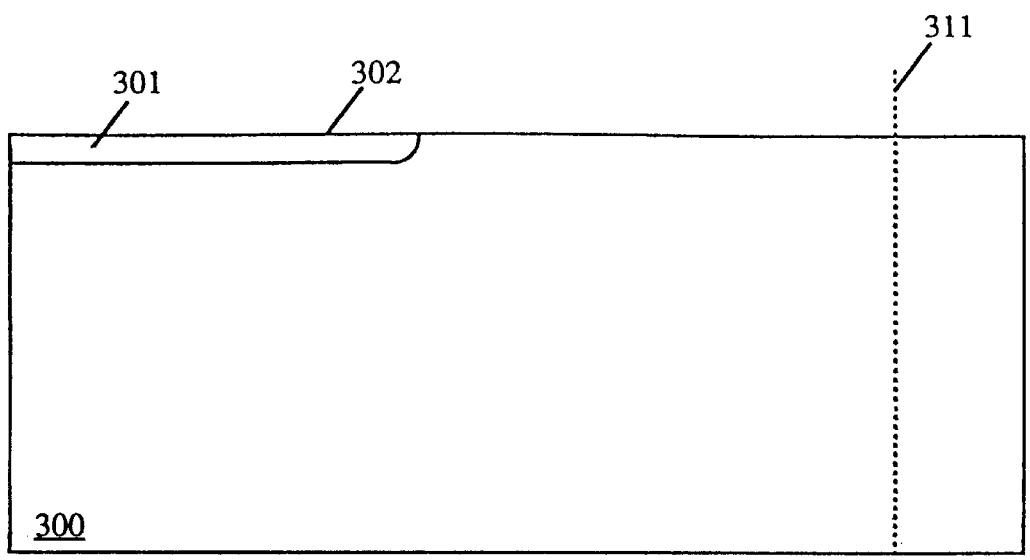
FIG. 3(b) shows a cross-sectional side view of a portion of the wafer of the previous figure showing a area for an electronic circuit or component and a connection point within that circuit or component.
Figure 11A:
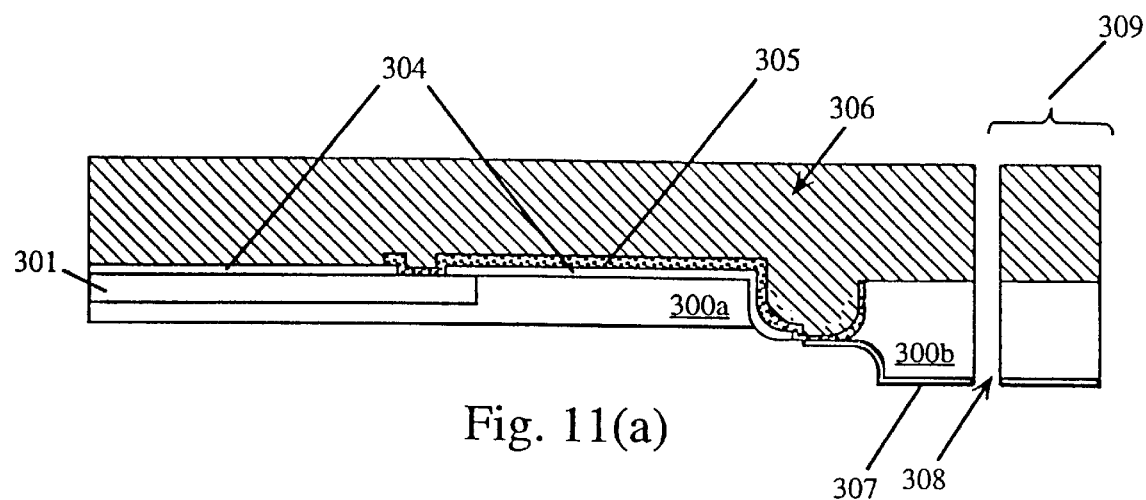
FIG. 11(a) shows a cross-sectional side view of the resulting electronic device and contact after the wafer portion of the previous figure has been sawed to separate each individual electronic device.
Figure 12:
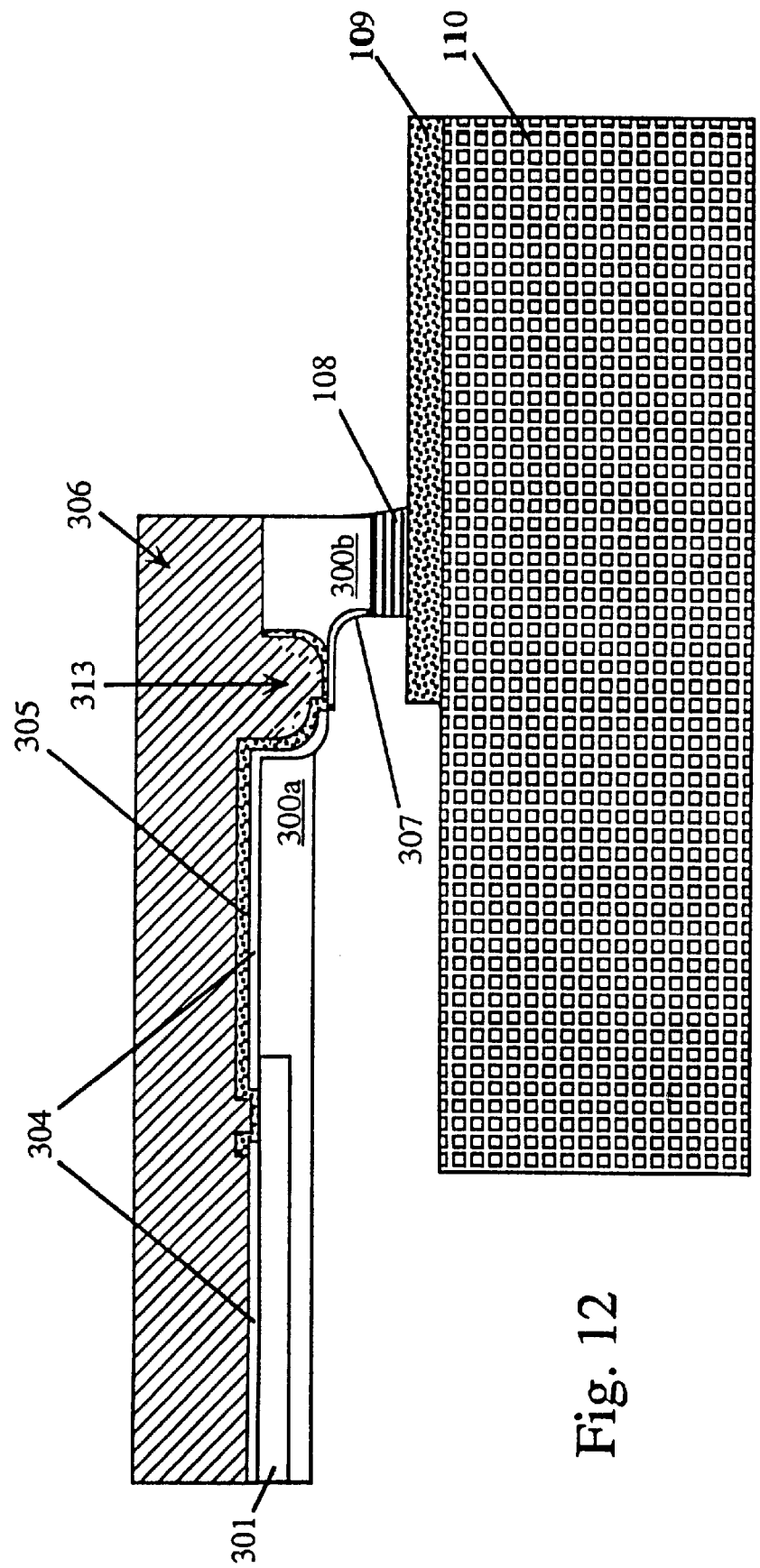
FIG. 12 shows a cross-sectional side view of the electronic device and contact of the previous figure after being soldered onto a circuit board.
Figure 13A:
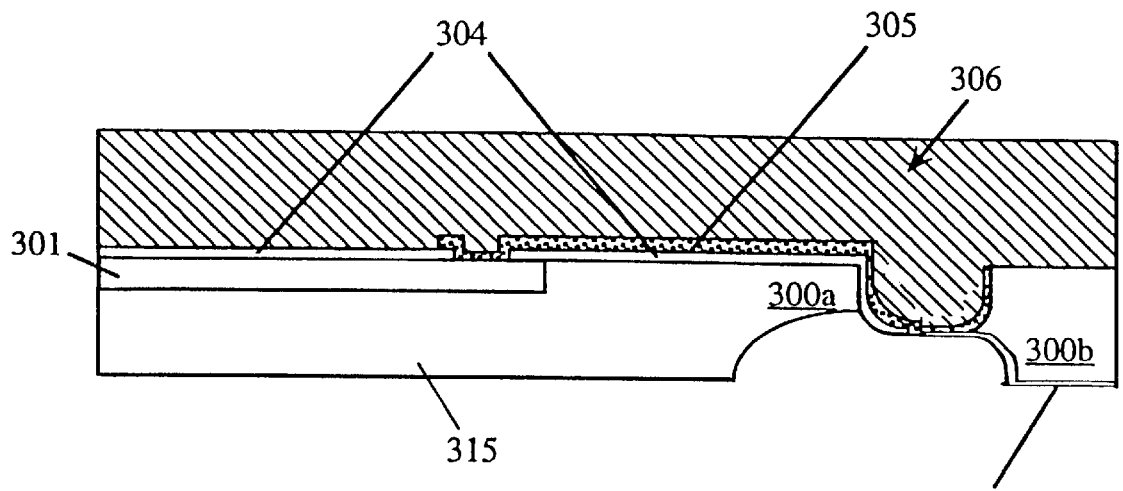
FIG. 13(a) shows a cross-sectional side view of a device comparable to that of FIG. 11(a) but with a bottom substrate surface that drops down to circuit-board level to dissipate heat generated in the electronic device by transferring the heat to the circuit board.
Figure 14:
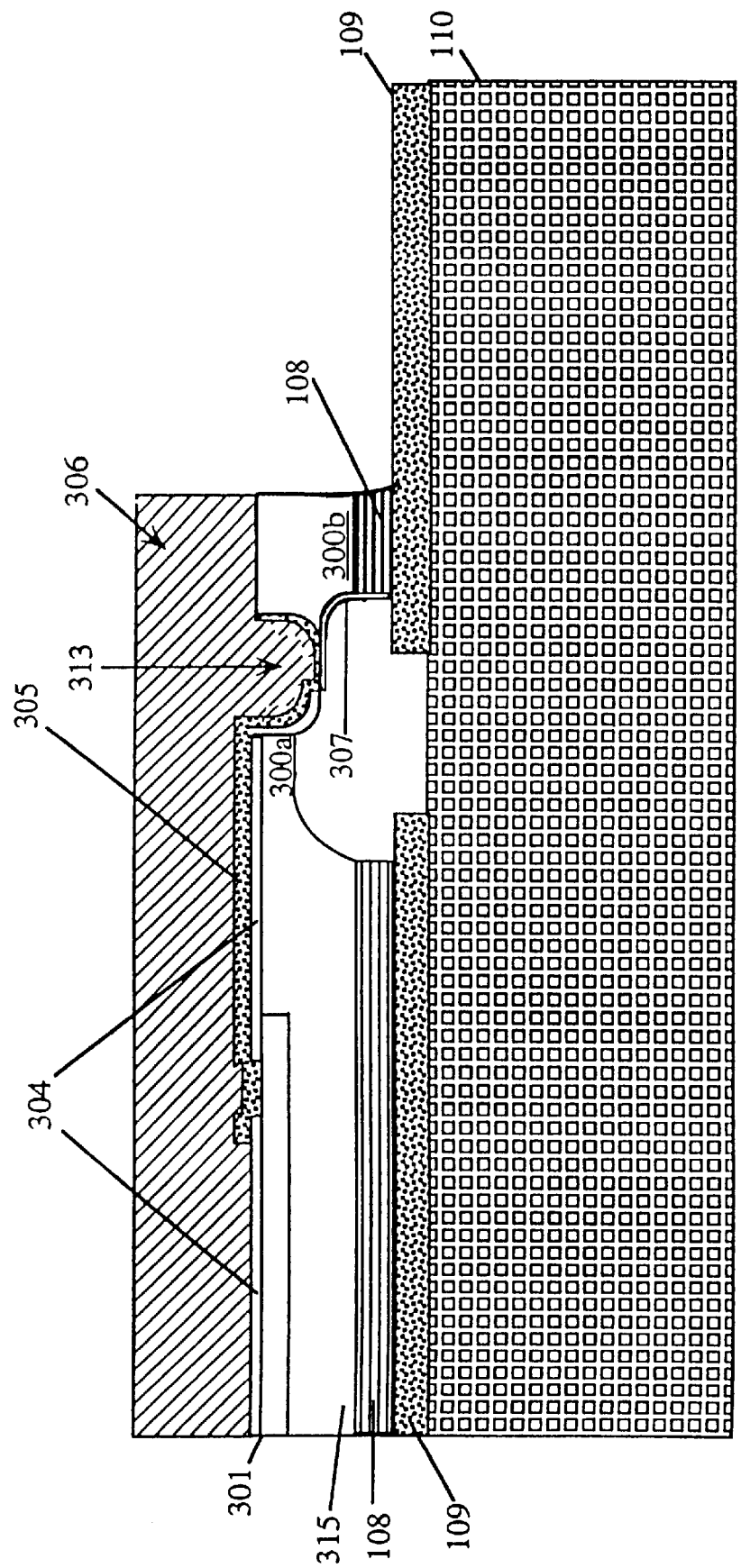
FIG. 14 shows a cross-sectional side view of the electronic device, contact and drop bottom of the previous figure after being soldered onto a circuit board.

Contacts comprising a conductive substrate post and a wire that is wrapped down the inside surface of the post are shown in FIG. 11(a) and FIGS. 13(a). How such contacts are attached to a circuit board is shown in FIG. 12 and FIG. 14. How such a contact is fabricated is shown in FIG. 3 though FIG. 11. During fabrication, a semiconductor wafer is held by a carrier while the process steps are performed.

A brief description of how such a contact can be fabricated is as follows:

1) A relatively large trench is formed in the top surface of a substrate, such as but not limited to a semiconductor wafer. The trench may be located near the edge of an electronic circuit or component, such as but not limited to an integrated circuit. The circuit or component is formed using the substrate, or is attached to the substrate.

2) An insulation layer is formed that has a through hole over a connection point within the circuit. The insulation layer ends part way through the trench.

3) An upper or interconnection wire is formed that runs from the connection point into the trench.

4) The top of the substrate is encapsulated, thus forming an encapsulant protrusion in the trench. Optionally, the encapsulant includes a cap layer.

5) The substrate is thinned from the bottom, thus forming the bottom surface of a substrate post, which is located near the encapsulant protrusion. The substrate is further selectively thinned from the bottom, thus exposing part of the bottom surface of the upper wire on the encapsulant protrusion and forming the inside surface of the substrate post.

6) A lower wire or contact layer is formed that runs on the bottom surface of the substrate from the exposed portion of the upper wire, down the inside surface of the substrate post, and optionally across its bottom surface.

7) Optionally, contact pads are defined by sawing or etching, thus forming the side edges of the contact posts.

8) Optionally, the top surface of the electronic devices are marked, so as to identify the part type and the orientation of pin number 1.

9) The wafer is diced, thus forming the outside surface of the substrate post. For some embodiments, this completes the fabrication of the electronic device.

10) Optionally, the electronic devices are tested while in the original pattern on the carrier.

Considering this fabrication process in more detail, FIG. 3 is a top view of substrate wafer 300. The top surface of substrate wafer 300 has been used to fabricate a number of integrated circuits each within a rectangular die that is replicated or tiled across the wafer. Line 311 is one of the lines along which substrate wafer 300 will be separated or diced into individual electronic devices—finished electronic devices, not merely die requiring a subsequent assembly process.

Any material that is suitable for the fabrication of electronic circuitry and is that is suitable for shaping via etching, shaving or the like can be used for substrate wafer 300. In some embodiments, substrate wafer 300 is formed of crystalline silicon (Si). Other embodiments use other semiconductors for substrate wafer 300 such as but not limited to the following: gallium arsenide (GaAs), silicon germanium (SiGe), silicon carbide (SiC), gallium phosphide (GaP) or the like. Yet other embodiments use insulative substrates, such as, but not limited to ceramic materials, sapphire, quartz or the like.

FIG. 3 also shows a cross-sectional view of substrate wafer 300, the cross section being taken along line 3(b). The top surface of substrate wafer 300 has been used to fabricate an integrated circuit within electronic circuit region 301: Electronic circuit region 301 includes connection point 302. An electrical signal or power supply voltage must be connected between connection point 302 and circuitry external to the finished electronic device in order for it to operate properly.

Various techniques for fabricating electronic circuits using substrate wafer 300 are known in the art as well as for attaching fabricated electronic circuits to substrate wafer 300. The description below of the contact fabrication process assumes that the fabrication of the electronic circuit or component or its attachment to substrate wafer 300 has been completed.

The electronic circuit region 301 suggests an integrated circuit that is fabricated using the top surface of substrate wafer 300. Nevertheless, the techniques and embodiments described throughout this disclosure apply to contacts for any electronic circuit or discrete electronic component that can be fabricated using, or attached to, substrate wafer 300. For example, a passive discrete component, such as, but not limited to a resistor or capacitor, or an active discrete component such as, but not limited to a transistor, power transistor, diode, thrysister, field-effect transistor (FET) or the like could include connection point 302 and could have contacts fabricated according to any of the techniques or embodiments disclosed herein. As a further example without limitation, various integrated circuits or other electronic circuits could be attached to substrate wafers 300, could include connection point 302, and could then have contacts fabricated according to any of the techniques or embodiments disclosed herein.

Generally, an electronic circuit is formed within, or attached to, a square or rectangular region 301 that is replicated both horizontally and vertically, thus covering the top surface of substrate wafer 300. One edge of electronic circuit region 301 is shown in FIG. 3. Connection point 302 is typically near that edge, but might be located away from the edge if desired. Another replication of electronic circuit region 301, which is not shown in FIG. 3, may be located to the right of electronic circuit region 301.

Figure 2:
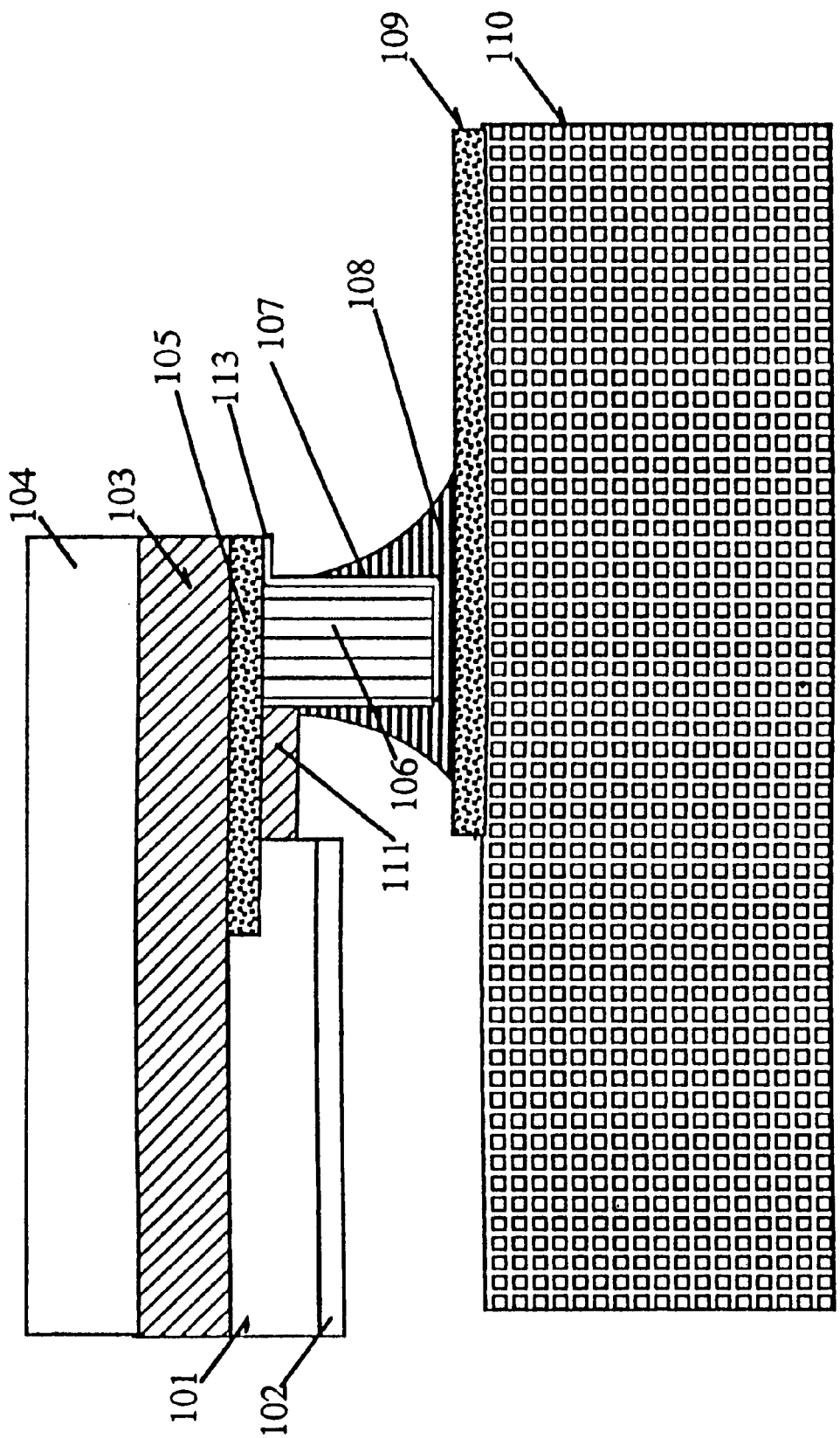
FIG. 2 illustrates a cross-sectional side view of a prior-art integrated circuit wrap-around flange contact that has been soldered onto a circuit board.

A potential advantage of the present method of fabricating contacts is higher wafer packing density. That is, the area of substrate wafer 300 that must be dedicated to forming contacts might be reduced over that required, for example, in the prior-art contact shown in FIG. 2. This may allow more replications of electronic circuit region 301 to fit on a wafer, and thus may reduce manufacturing cost per device.

Figure 4:
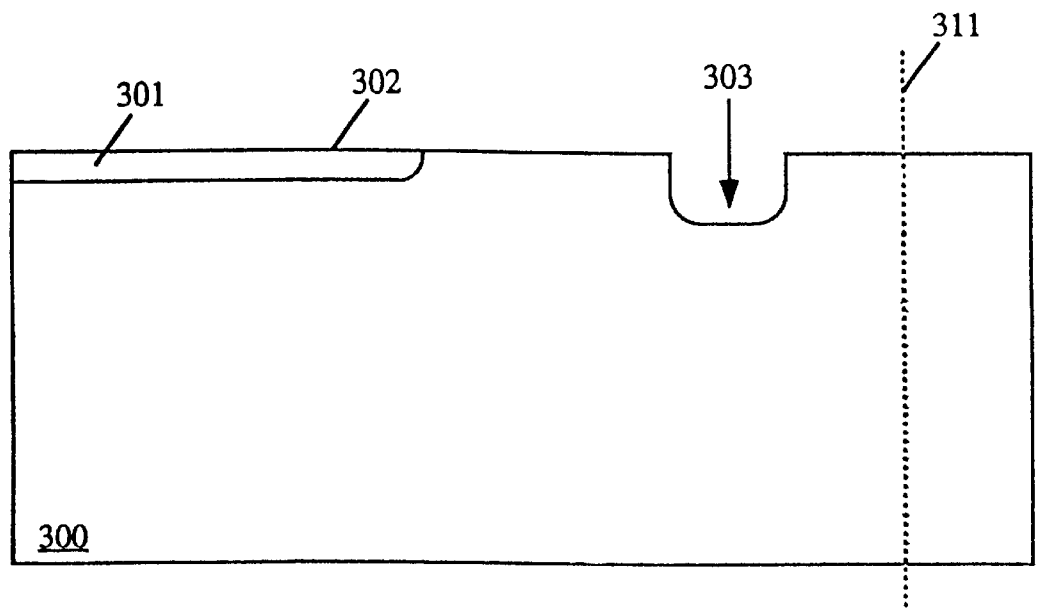
FIG. 4 shows a cross-sectional side view of the wafer portion of the previous figure after a trench has been etched in the wafer near one edge of the active surface area.

As shown in FIG. 4, the first step in fabricating a contact with a substrate post is to form a trench in substrate wafer 300 near, and possibly parallel to, an edge of electronic circuit region 301. Trench 303 can be formed by any technique, such as but not limited to wet chemical etching, dry plasma etching, mechanical micro machining, sawing, diamond-tip sawing or the like. It might be advantageous to use a technique that allows a relatively deep but narrow trench to be formed, such as but not limited to cutting a starter trench with a diamond-tip saw and then etching, using etching techniques and specialized equipment designed for deep narrow trenches, or the like.

Trench 303 is a relatively deep recess (150 microns deep, for example) into substrate wafer 300. As will become clear, trench 303 must be formed deeper than the thickness of the substrate that will remain beneath electronic circuit region 301 in the finished device.

Numerous methods of forming trench 303 of a suitable size and shape are known. For example, the regions of substrate wafer 300 that are not to be etched can be protected by a photolithographic chemical resist and etch process as follows:

A mask is prepared on a glass plate. The mask determines which areas of substrate wafer 300 are to be protected. Substrate wafer 300 is coated with a photosensitive resist layer, then ultraviolet light is projected onto the regions that are to be etched (or that are not to be etched). The resulting substrate wafer 300 is subjected to a resist-developer chemical solution that removes only the regions of the resist that were exposed to the ultraviolet light (or that were not exposed to the ultraviolet light). A chemical etch solution is applied that etches substrate wafer 300 in those regions not protected by the resist. After etching has occurred to the desired depth and width, the resist is removed by a resist-dissolving solution.

In other embodiments, dry plasma or ion etching processes can be used instead of the above described wet chemical etch process. In alternative embodiments, there can be a photosensitive layer applied and developed on top of a non-photosensitive resist layer, which is then selectively removed prior to the etch process. Any method of forming trench 303 of a suitable size and shape can be employed.

Figure 5:
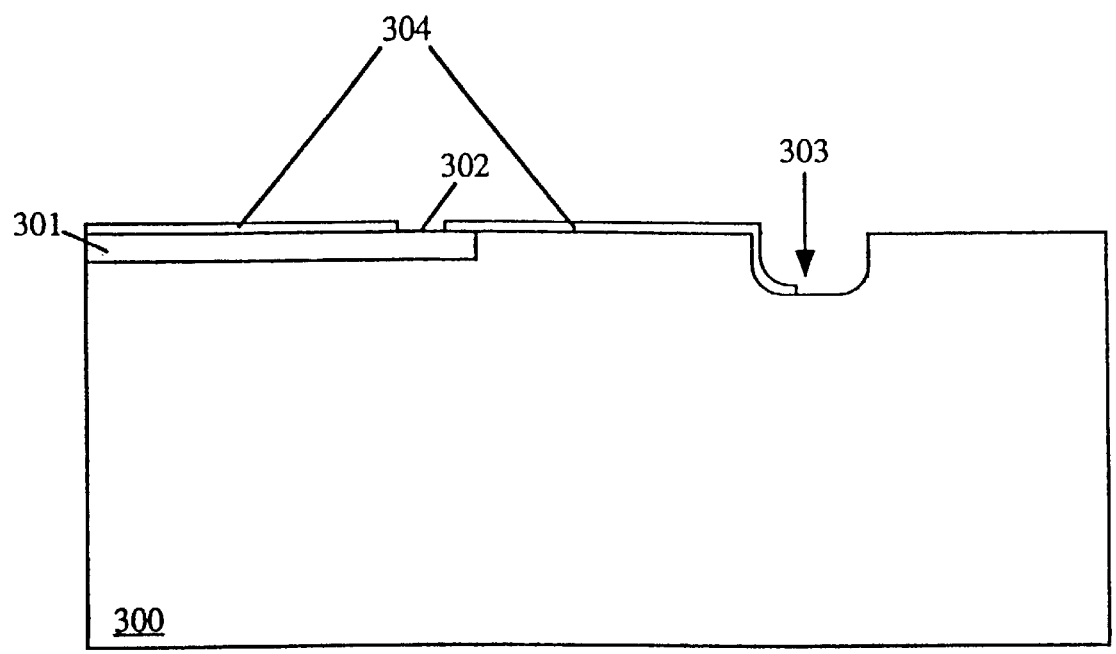
FIG. 5 shows a cross-sectional side view of the wafer portion of the previous figure after an insulator has been formed on selected portions of the top of the wafer according to a pattern.

As shown in FIG. 5, the next step in fabricating a contact for embodiments using a conductive substrate wafer 300, is to form insulation layer 304 (with a thickness of 25 microns or less, for example) on selected regions of substrate wafer 300. Insulation layer 304 is formed in a pattern such that connection point 302 and a portion of trench 303 are not insulated.

The embodiment shown in FIG. 5 has insulation layer 304 directly on top of substrate wafer 300. In other embodiments, insulation layer 304 is separated from substrate wafer 300 by other layers (not shown) that form the electronic circuit. Such layers can include, but are not limited to interconnect layers, insulation layers or the like. In some embodiments, insulation layer 304 serves as the passivation layer over electronic circuit region 301.

Insulation layer 304 can be formed by any technique that selectively forms regions of an insulation layer on top of a substrate according to a pattern. Any technique for forming a layer of any insulating material on top of substrate wafer 300 can be used, such as but not limited to the following: silicon oxide grown from a silicon substrate wafer by an oxidation process (at least for those regions where the substrate is exposed); or silicon oxide ($SiO_2$) or silicon nitride ($Si_3N_4$), aluminum oxide ($Al_2 O_3$), polymide resins, epoxy, acrylics, patternable plastics deposited on top of substrate wafer 300; or the like. Any technique for selectively removing regions of that insulation layer can be used, such as, but not limited to a photolithographic etch processes, photolithography directly on a photosensitive insulator, or the like.

Figure 6:
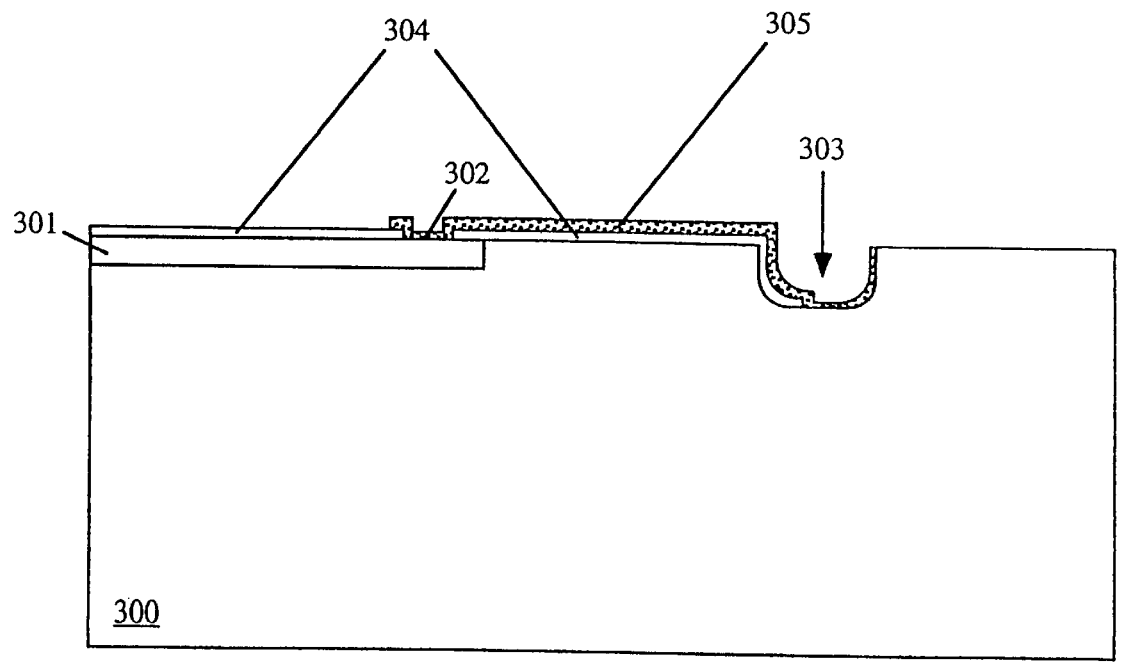
FIG. 6 shows a cross-sectional side view of the wafer portion of the previous figure after a gold wire has been formed on top of the wafer and the insulator.

As shown in FIG. 6, the next step in fabricating a contact is to form a beam or an interconnection wire 305 (for example, 6 to 10 microns thick and 25 microns wide, or a width going up to whatever is appropriate for the current carried). Interconnection wire 305 extends from connection point 302 within electronic circuit region 301 into the non-insulated portion of trench 303. Any technique of forming interconnection wire 305 can be used, such as but not limited to pattern plating, sputter deposition of a metal layer within a low-pressure inert gas followed by photolithographically selective etching of that layer, or the like.

Interconnection wire 305 can be any substance of suitable conductivity, for example a metal, such as but not limited to gold (Au), silver (Ag), copper (Cu), aluminum (Al), nickel (Ni), alloys thereof or layers thereof.

Interconnection wire 305 as well as the other metal, wire, interconnect or contact layers described herein might be advantageously formed of layers of metals, such as but not limited to the following: a thin barrier metal layer (as can allow current to flow between certain metals while avoiding the metals directly touching) or a thin seed metal layer (as can facilitating forming a metal layer by plating); followed by a main layer; followed by a gold flash layer (as can resist corrosion).

Figure 7:
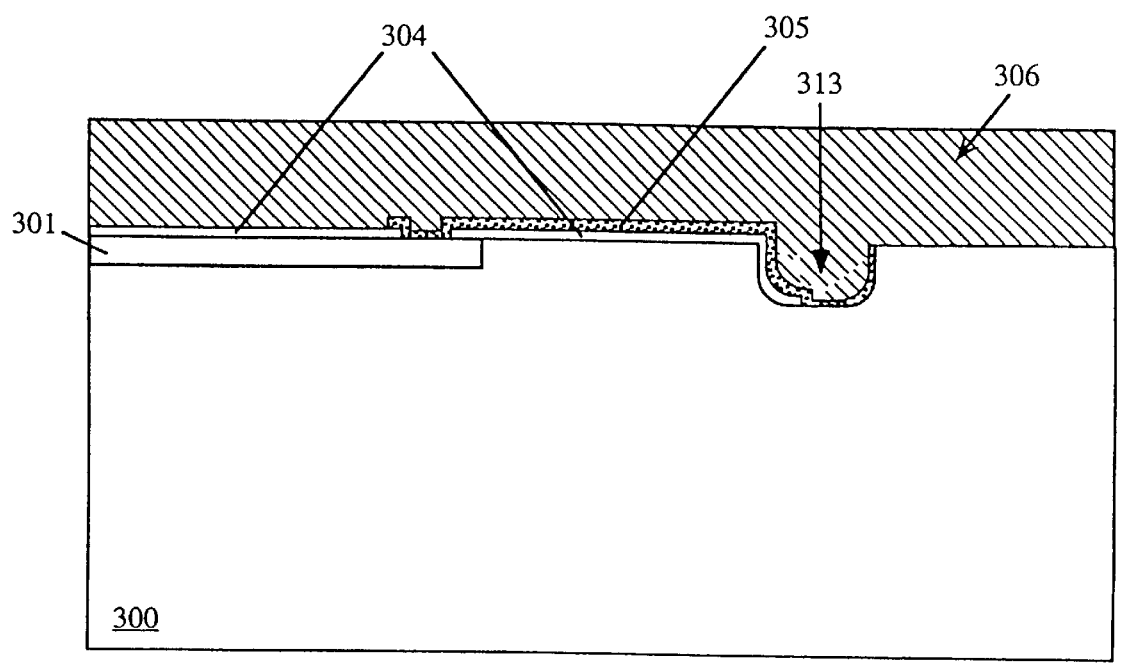
FIG. 7 shows a cross-sectional side view of the wafer portion of the previous figure after a relatively thick layer of epoxy has been applied to the top surface of the wafer, the insulator, and the gold wire, which encapsulates them into a strong and rigid unit and which forms an encapsulant protrusion.

As shown in FIG. 7, the next step in forming a contact is to encapsulate substrate wafer 300, insulating layer 304 and interconnection wire 305. The top surfaces of these structures are covered with a relatively thick layer (150 microns, for example) of a strong and insulative encapsulant. The encapsulant fills trench 303, thus forming encapsulant protrusion 313.

Encapsulant layer 306 can be formed of epoxy, glass, plastic, polymide resins, Teflon®, silicon oxide ($SiO_2$), silicon nitride ($Si_3N_4$), mixtures thereof, layers thereof, or any other material that is non-conducting, relatively rigid and strong, and sufficiently flexible or compliant to allow for thermal expansion both in subsequent wafer processing and in the complete electronic system. For example, Hysol® FP4650 epoxy manufactured by Dexter Corp., Electronic Materials Division, of Industry, California, might be suitable for encapsulant layer 306. As an alternative to being compliant, encapsulant layer 306 can be formed of a material with thermal expansion characteristics similar to those of substrate wafer 300.

Encapsulant layer 306 can be applied using a variety of techniques. These techniques may attempt to keep encapsulant layer 306 at a uniform thickness, or to eliminate air bubbles within encapsulant layer 306 or between it and substrate wafer 300, insulating layer 304 and interconnection wire 305. In some embodiments, substrate wafer 300 is spun, possibly in a centrifuge, to form encapsulant layer 306. In alternative embodiments, encapsulant layer 306 comprises a high-temperature insulative epoxy material that is cured in a furnace.

In some embodiments, encapsulant layer 306 can include a top or cap layer (not shown) containing materials, such as but not limited to the following: silicon, polysilicon, amorphous silicon, plastic, glass, epoxy, aluminum, diamond, mixtures thereof, layers thereof, or any other material that is relatively rigid and strong. This cap layer can make the finished electronic device more mechanically rugged. It can also serve as a thermal conduit to dissipate heat produced by the operating electronic device. This cap layer need not be an insulator.

Figure 8:
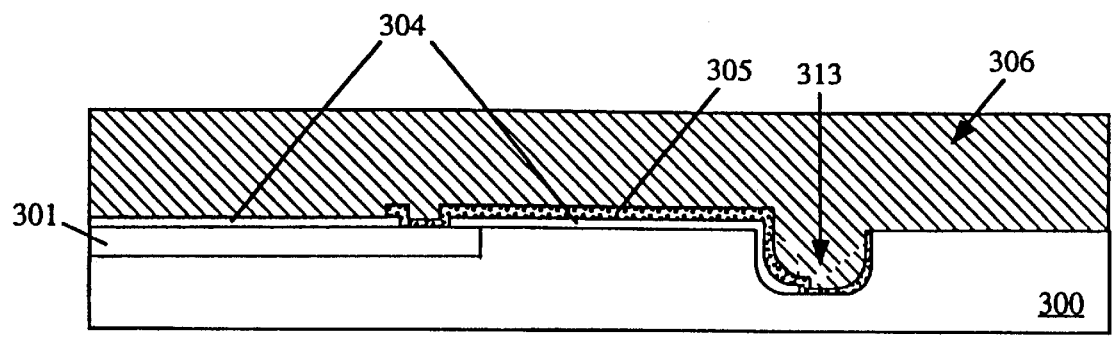
FIG. 8 shows a cross-sectional side view of the wafer portion of the previous figure after the wafer has been thinned from the bottom to form the bottom surface of a substrate post.

As shown in FIG. 8, the next step in fabricating a contact is to remove material from the bottom surface of substrate wafer 300 so as to reduce its thickness. Any method of removing substrate material from the back of substrate wafer 300 can be used, such as but not limited to back planing, back lapping, sandblasting, grinding, wet chemical etching, dry plasma etching or the like.

As will become clear, the thickness remaining of substrate wafer 300 determines the height of the substrate post in the contact in the finished device. For example, thinning the substrate wafer to a thickness of 150 microns allows a substrate thickness of 100 microns in the finished packaged device and a 50 micron standoff between the bottom surface of the contacts and the bottom surface of the device.

Figure 9:
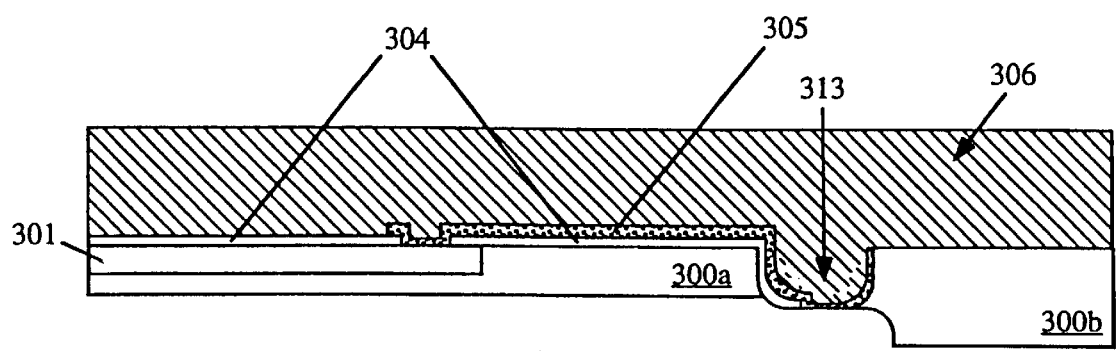
FIG. 9 shows a cross-sectional side view of the wafer portion of the previous figure after selected portions of the wafer's bottom have been further thinned, which exposes the gold wire at the bottom of the protruding encapsulant, and which forms the inside surface of the substrate post.

As shown in FIG. 9, the next step is to selectively remove material from the bottom surface of substrate wafer 300 so as to reduce (by 150 microns, for example) its substrate thickness over electronic circuit region 301. Any method of selectively removing substrate material from the back of substrate wafer 300 can be used, such as but not limited to the following: photo-lithographically selective wet chemical etching; photo-lithographically selective dry plasma; ion etching; or the like. In some embodiments, the thinning steps of FIG. 8 and FIG. 9 might be combined into a single step.

Sufficient material must be removed that a portion of interconnection wire 305 is exposed on the bottom or the sides of the encapsulant trench. This back thinning separates substrate wafer 300 into two portions:

1) a substrate portion 300a, upon which or within which is electronic circuit region 301; and
2) a substrate post portion 300b, which becomes part of the contact.

Figure 10:
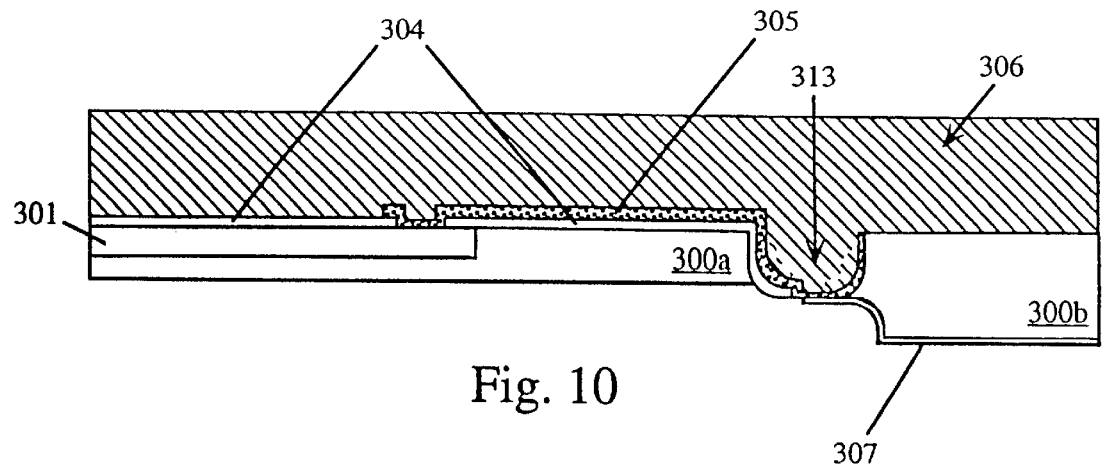
FIG. 10 shows a cross-sectional side view of the wafer portion of the previous figure after a contact wire has been formed along the exposed gold wire and the substrate post.

As shown in FIG. 10, the next step in fabricating a contact is to selectively form lead wires or a contact layer 307 (6 to 10 microns thick, for example) on the bottom surface of substrate wafer 300. One end of contact layer 307 connects with the exposed portion of interconnection wire 305. The other end of contact layer 307 connects to substrate post 300b and optionally extends over its bottom thus forming the bottom of the contact being fabricated.

Contact layer 307 is formed from a metal or other conductor that facilitates connecting the contacts of the electronic device with the wiring on the surface to which the device is mounted. In embodiments where soldering is used to form connections, contact layer 307 can be made of an easily solderable conductor such as but not limited to the following: nickel (Ni), nichrome-gold, nichrome-nickel, nickel-arsenic-gold, nickel-arsenic, nickel-gold, gold-tin-oxide (ATO), palladium-silicide, titanium (Ti), tungsten (W), titanium—tungsten (Ti—W), indium titanium oxide (ITO), aluminum (Al), copper (Cu), platinum (Pt), alloys thereof or layers thereof. Gold (Au) or silver (Ag) can also be used for contact layer 307.

Any method of forming contact layer 307 according to a pattern can be used, including but not limited to pattern plating. Pattern plating is not wasteful of materials and can be faster than, and result in a higher quality contact layer 307 than would result from depositing contact layer 307 by evaporation or sputtering.

Various methods of pattern plating are known and can be used to form contact layer 307. One such method is as follows: A first layer (0.2 microns thick, for example) of titanium—tungsten (Ti—W) is deposited on the bottom of substrate wafer 300. A second layer (0.2 microns thick, for example) of gold (Au) is deposited over the first layer. The second layer is then selectively coated by a photo resist layer (6 to 10 microns thick, for example) in the regions where contact layer 307 is not to be formed. Electroplating is then used to form a contact layer 307, which can actually become thicker than the photoresist layer. The photoresist layer is then stripped off and the first and second layers are etched away where they are not protected by contact layer 307.

Optionally, the next step in fabricating a contact is to define the contact pads, that is to separate substrate post region 300b into individual posts, one for each contact. For example, 150 microns of substrate post region 300b could be removed between each post, which could have a square bottom surface of 150 microns by 150 microns on a 300 micron inter-contact pitch.

As another example, 200 micron s of substrate post region 300b could be removed between each post, which could have a rectangular bottom surface of 400 micron s (length along the device's edge) by 200 micron s (width perpendicular to the device's edge). This would result in the contacts having a 600 micron inter-contact pitch.

The contact's bottom surface dimensions can vary from contact to contact, though typically all contacts along the same edge of the device would have the same width. As yet another example, some contacts could have a length of 200 microns and some a length of 2000 microns, depending on the current they will carry during the operation of the electronic device. This would result in a variable inter-contact pitch.

For some uses of some types of electronic devices, it potentially is a significant advantage to be able to vary the contact's surface area. In the absence of this ability, if the current carrying capacity of a single contact is exceeded, then multiple contacts must be dedicated to carry the same signal or power-supply voltage level. Also, the ability to vary the contact's surface area might help reduce parasitic circuit elements such as resistance and inductance that can be introduced by a contact. Such a reduction could be a significant advantage in some cases, such as for power switching devices.

This separation between contacts can be done by any suitable technique, such as but not limited to etching, sawing, micro machining or the like. If the substrate is conductive, then all of the substrate between posts must be removed so as to electrically isolate each contact. If the substrate is insulative, then complete separation of the substrate into individual posts is not necessary for electrical reasons. Complete or partial separation of the substrate into posts and might or might not be desirable for mechanical reasons.

In some embodiments, active circuitry may be placed on the substrate region characterized herein as the post. For some applications of some electronic devices, it can be very advantageous to separate active circuitry within the same finished electronic device into portions located in separate substrates. Such separate substrates can help provide thermal isolation, electrical isolation, or both.

A portion of the device's circuitry may be located in a primary substrate, possibly electronic circuit region 301 (as shown in FIG. 3). Other portion(s) of the circuitry may be located in one or more secondary substrates, which may be (or may be formed analogously to) substrate post region 300b (as shown in FIG. 9). Active devices could be formed within substrate post region 300b by applying known device fabrication techniques to the bottom surface of wafer 300, either before or after separate substrate regions 300b are formed. Alternatively, two or more electronic circuitry regions 301 that are adjacent within wafer 300 could be dual substrates that form a single packaged electronic device.

Cooler operating conditions for the devices within electronic circuitry region 301 may be achievable by thermally isolating heat generating circuitry. This could include, but not be limited to, fabricating high power drivers within one or more substrate post regions 300b.

Electronic noise isolation may be increased by putting noise generating circuitry within one substrate region and noise sensitive circuitry within a separate substrate region. This could include, but not be limited to, fabricating analog circuitry within a first electronic circuitry region 301 and fabricating highly interconnected or functionally related digital circuitry within a second electronic circuitry region 301 that is adjacent to the first, where both electronic circuitry regions 301 will become the same finished electronic device.

In some embodiments, the top surface of the electronic devices can be marked while the devices are still attached to the wafer, so as to identify such information as the part type and the orientation of pin number 1. A screening process or the like can be used for that marking.

The electronic devices described throughout this disclosure can be tested while still in wafer form just prior to, or during, a final separation step. If the operation of each device is not affected by its contacts being still connected to those of the adjacent devices, then testing of each electronic device can occur just prior to their being separated into individual devices.

Alternatively the device separation and testing can occur in three steps:

1) Sawing or etching the wafer from the bottom deep enough to electrically separate the contacts of adjacent devices, but not so deep as to mechanically separate them;
2) Complete separation of the electronic devices.
3) Testing of each individual electronic device while still in position on a carrier; and Whether or not an electrical separation step is required, testing while still on the wafer might provide significant cost savings over prior-art techniques, in which typically a wafer is tested and any defective dies within the wafer are marked, then the non-marked dies are assembled into packaged devices, and then the packaged devices are then tested a second time.

Alternatively, the packaged devices can be tested after being separated from the wafer without any wafer testing. If the yield of the wafer is high enough, the wafer testing step might be unnecessary—even if the bad devices were marked it may not be feasible to sort out the good devices for processing that differs from the processing of the bad devices.

Figure 11B:
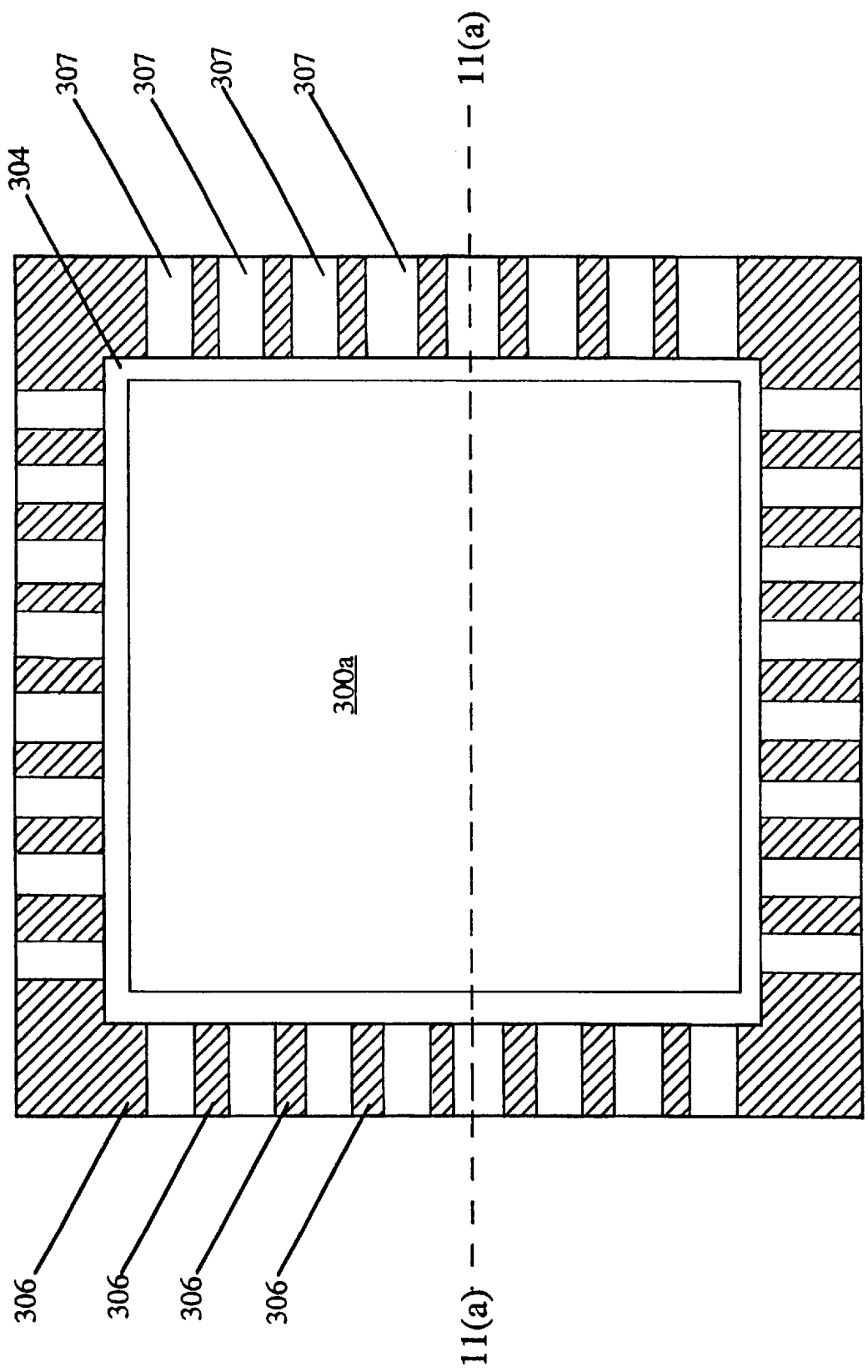
FIG. 11(b) shows a bottom view of the same electronic device, which has multiple contacts in a row along each edge.

The final step in forming a contact according to this embodiment is to separate substrate wafer 300 into individual electronic devices, as shown in FIG. 11(*a*). This separation can be achieved by any method, such as but not limited to sawing, etching, or the like. The separation formed by that sawing or etching forms the outside surface of substrate post 300b and finishes the fabrication of the contact.

In some embodiments, the electronic device is now completely packaged, unlike those prior-art techniques in which wafers are separated into dies, which are subsequently assembled into packaged devices. Alternatively, additional test or marking steps might be required. Alternatively, additional device assembly steps might be required in embodiments where contacts on the bottom of the device as disclosed herein are combined with additional contacts on the top of the device that are fabricated using other techniques. For some uses of some types of electronic devices, it may be an advantage that contacts as disclosed herein can be combined in the same electronic device with top-side connections.

Portion 309 of substrate wafer 300 and encapsulant 306 can be waste material between devices, or portion 309 can be the contact of an adjacent device.

FIG. 11(*b*) is a bottom view of the same electronic device shown in the previous figure, the previous figure being a cross section view taken along line 11(*a*). As shown, substrate region 300b is completely separated between posts, which exposes encapsulant layer 306. However, separation of substrate region 300b into completely disconnected posts is optional if the substrate is insulative.

FIG. 11(*b*) shows multiple contacts on each edge of the electronic device. As shown, there are only a few contacts on each edge of the electronic device. In practice there would be many such contacts on each edge.

For example, a square package with sides of 7.5 millimeters in length (approximately 0.3 inches) could include a total of 100 contacts along its four edges using a pitch of approximately 300 micron s between contacts. Also for example, a typical prior-art microprocessor having 200 contacts around the edges of a 38 millimeter square package (approximately 1.5 inches) could be packaged according to the above substrate post embodiment, using a relatively conservative inter-contact pitch of approximately 760 microns. As another example, a leading-edge integrated circuit having 500 contacts around the edges of a 38 millimeter square package would require an inter-contact pitch of approximately 300 microns.

An inter-contact pitch of 300 microns is straightforward to achieve using the above substrate post embodiment. In fact, the inter-contact pitch achievable in practice is likely to be limited by circuit board considerations, not the contacts. It may be difficult to reliably fabricate circuit board conductor 109, as shown in FIG. 12, with less than 150 microns spacing between conductors that are less than 150 microns in width.

The contact fabricated comprises substrate post 300*b* and contact layer 307. The relative simplicity of this contact might help to minimize parasitic elements being introduced into the circuit in which the contact is used. For some uses of some types of devices, including but not limited to power-switching devices and the like, this might be a significant advantage.

Figure 1:
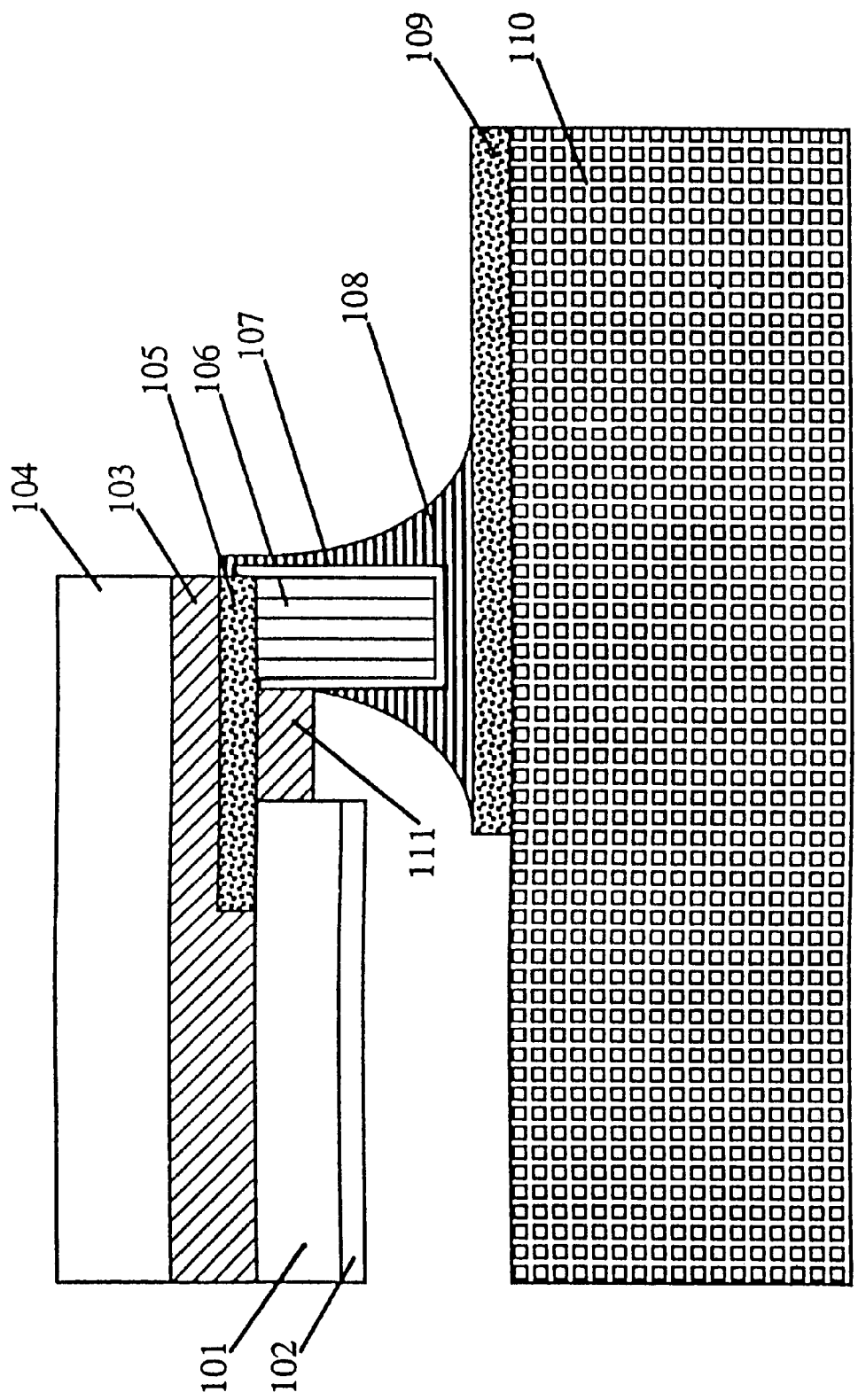
FIG. 1 illustrates a cross-sectional side view of a prior-art integrated circuit butt-joint contact that has been soldered onto a circuit board.

Contact layer 307 is said to inside-wrap substrate post 300*b*. In contrast in the prior-art contact shown in FIG. 1, nickel plate 107 wraps around the outside surface of silicon post 106 to form a problematic electrical connection to metal bridge 105 via a butt-joint.

As shown in FIG. 12, the contact of the electronic device can be soldered to circuit board conductor 109 with solder fillet 108. Circuit board conductor 109 has been formed over circuit board substrate 110. Solder fillet 108 provides both mechanical and electrical connection between the contact and the circuit board. Contacts disclosed herein are suitable for connecting with a circuit board using a variety of techniques, such as but not limited to surface mount soldering, gold compression bonding, epoxy, conductive epoxy or the like. The contacts described throughout this disclosure are suitable for connection to a variety of apparatus, including but not limited to circuit boards, glass plates, or the like.

Figure 13B:
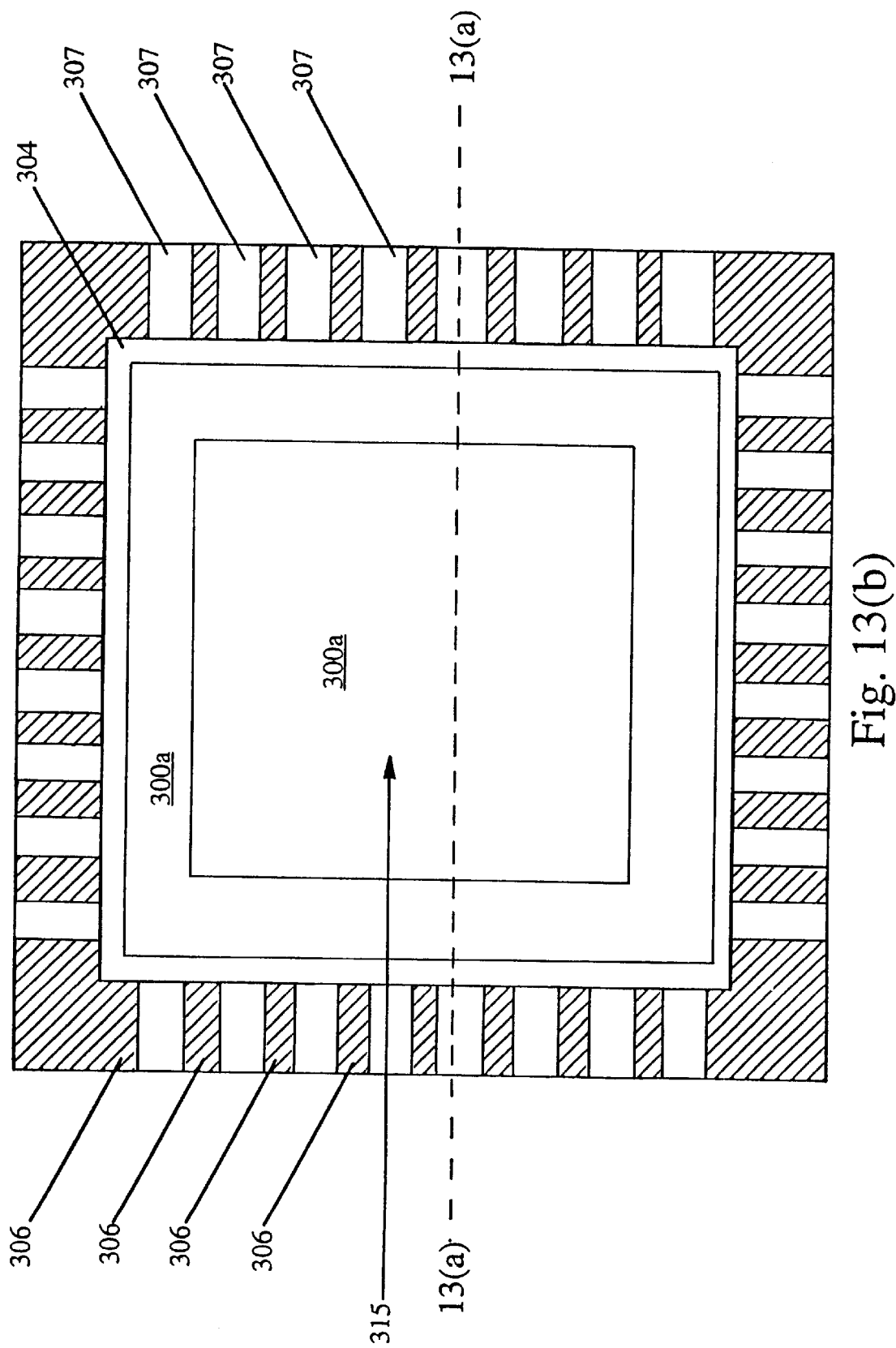
FIG. 13(b) shows a bottom view of the same electronic device, which has a large square drop bottom.

FIG. 13 shows an electronic device similar to that of FIG. 11, except that it includes drop bottom 315. Drop bottom 315 is a protruding portion of substrate 300. Drop bottom 315 is formed by not selectively not thinning portions of the bottom of substrate portion 300*a* during the selective thinning step discussed above in connection with FIG. 9. This results in drop bottom 315 having a bottom surface approximately co-planar with the bottom of the contacts of the finished electronic device. As shown in FIG. 13, the selective thinning provides a stand off between the electronic device and the circuit board to which the device is attached in the region near the contacts.

Drop bottom 315 connects with the circuit board or other apparatus to which the electronic device is attached, so that heat can be transferred out of the electronic device and into the circuit board, where the heat might be more easily dissipated without overheating the device.

FIG. 13(*b*) is a bottom view of the electronic device and FIG. 13(*a*) is a cross section view taken along line 13(*a*). As shown here, drop bottom 315 has a square bottom surface that forms most of the bottom surface of substrate portion 300*a*. Drop bottom 315 could have any shape and could cover more or less area depending on the heat dissipation needs of the electronic device and the heat absorption, transfer and dissipation characteristics of the circuit board or the like to which the device is mounted.

As shown in FIG. 14, both drop bottom 315 and the contact of the electronic device can be soldered to circuit board conductors 109 with solder filets 108. Solder filet 108 provides both mechanical connection and heat conduction with drop bottom 315. If substrate 300 is conductive, then the circuit board connector 109 connected to drop bottom 315 should either be electrically isolated or be tied to the substrate voltage appropriate for the electronic device.

Inside-Wrapped Contacts With an Insulative Substrate Post

Figure 15:
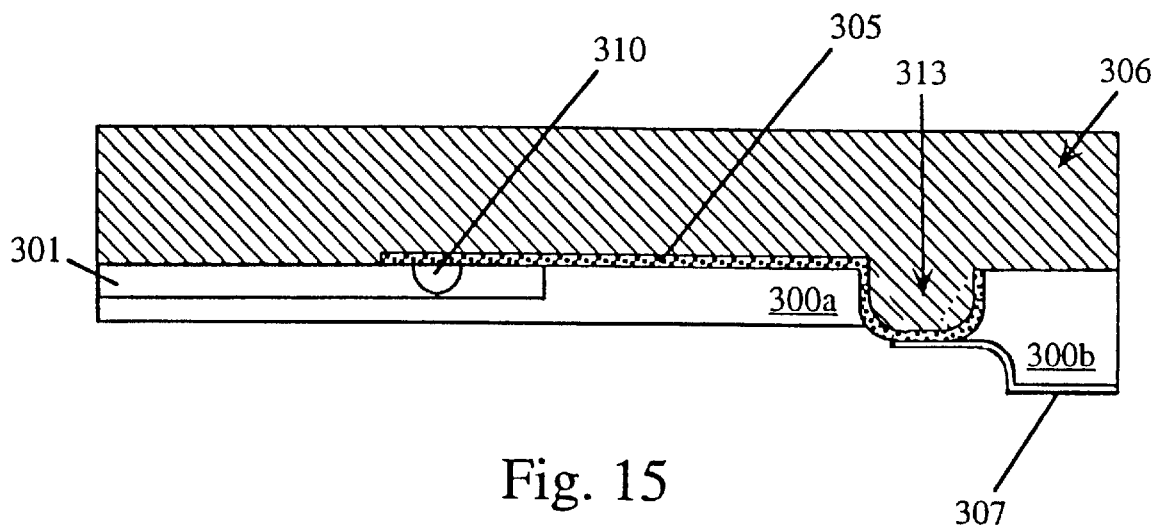
FIG. 15 illustrates a cross-sectional side view of an electronic device and contact comparable to that of FIG. 11(a), but made using a gallium arsenide substrate for which no insulator is necessary.

A contact comprising an insulative post, such as but not limited to gallium arsenide, and a wire that is wrapped down the inside surface of the substrate post is shown in FIG. 15.

A brief description of how such a contact can be fabricated is as follows:

1) A relatively large trench is formed in the top surface of a substrate, such as but not limited to a semiconductor wafer. The trench may be located near the edge of an electronic circuit or component, such as but not limited to an integrated circuit. The circuit or component is formed using the substrate or is attached to thesubstrate.

2) An upper wire is formed that runs from the connection point into the trench.

3) The top of the substrate is encapsulated, thus forming an encapsulant protrusion in the trench. Optionally, the encapsulant includes a cap layer.

4) The substrate is thinned from the bottom, thus forming the bottom surface of a substrate post, which is located near the encapsulant protrusion. The substrate is further selectively thinned from the bottom, thus exposing part of the bottom surface of the upper wire on the encapsulant protrusion and forming the inside surface of the substrate post.

5) A lower wire is formed that runs on the bottom surface of the substrate from the exposed portion of the upper wire, down the inside surface of the substrate post, and across its bottom surface.

6) Optionally, contact pads are defined by sawing or etching, thus forming the side edges of the contact posts.

7) Optionally, the top surface of the electronic devices are marked so as to identify the part type and the orientation of pin number 1.

8) The wafer is diced, thus forming the outside surface of the substrate post. For some embodiments, this completes the fabrication of the electronic device. The fabricated contact comprises the substrate post and the lower wire.

9) Optionally, the electronic devices are tested while still attached to the carrier.

Gallium arsenide is a semiconductor that, unlike silicon, does not significantly conduct electricity unless the gallium arsenide is doped. Patternable insulator layer 304 is not needed in gallium arsenide embodiments, or in other embodiments where substrate wafer is made of an insulator, such as but not limited to sapphire, quartz or the like. Also, the step of adding a patternable insulator described above in reference to FIG. 5 is not needed. Rather, interconnect wire 305 can be insulated from substrate wafer 300 by simply not doping the gallium arsenide substrate in the areas where there is to be no electrical conductivity.

FIG. 15 shows the contact that results in embodiments that use gallium arsenide as the substrate. A major difference from the contact of FIG. 11(a) is that insulation layer 304 is missing. Connection point 310 is formed by doping the gallium arsenide so that it becomes conductive at the point where interconnection wire 305 connects to it.

The process required to produce a contact according to this insulative substrate embodiment is even simpler than that disclosed for conductive substrates. Such simplicity may result in advantages such as reduced cost and higher yield. Also, the resulting contact has even fewer elements than for conductive substrates, which may help improve the reliability of the contact.

Inside-Wrapped Contacts on an Encapsulant Protrusion

A contact comprising an encapsulant protrusion and a wire that is wrapped around the encapsulant protrusion are shown in FIG. 22 through FIG. 25. How such contacts are fabricated is shown in FIG. 16 though FIG. 21.

A brief description of how such a contact can be fabricated is as follows:

1) A relatively large trench is formed in the top surface of a substrate, such as but not limited to a semiconductor wafer. The trench may be located near the edge of an electronic circuit or component, such as but not limited to an integrated circuit. The circuit or component is formed using the substrate or is attached to the substrate.
2) Optionally, an insulation layer is formed that has a through hole over a connection point within the circuit. The insulation layer ends part way through the trench.
3) A wire is formed that runs from the connection point into the trench.
4) The top of the substrate is encapsulated, thus forming an encapsulant protrusion in the trench. Optionally, the encapsulant includes a cap layer.
5) The substrate is thinned from the bottom, thus exposing part of the bottom surface of the wire on the encapsulant protrusion.
6) Optionally, contact pads are defined by sawing or etching, thus forming the side surfaces of the contact pads.
7) Optionally, the top surface of the electronic devices are marked, so as to identify the part type and the orientation of pin number 1.
8) The wafer is diced, thus forming the outside surface of the substrate post. For some embodiments, this completes the fabrication of the electronic device.
9) Optionally, the electronic devices are tested while still attached to a carrier.

Figure 16A:
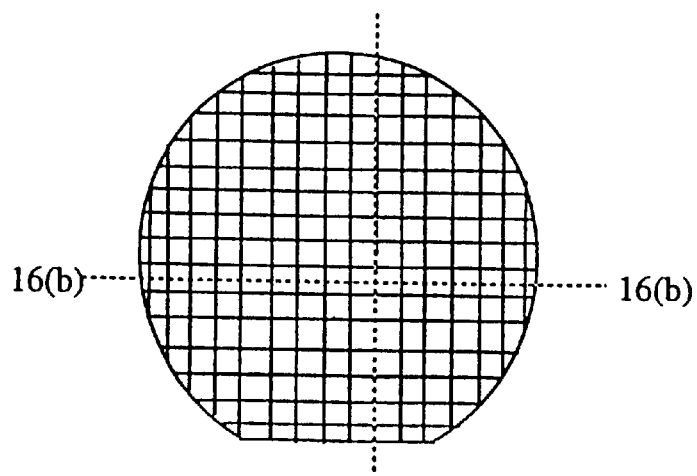
FIG. 16(a) illustrates a top view of a substrate wafer showing how its top surface is tiled with replications of die, each of which will become an electronic circuit.
Figure 16B:
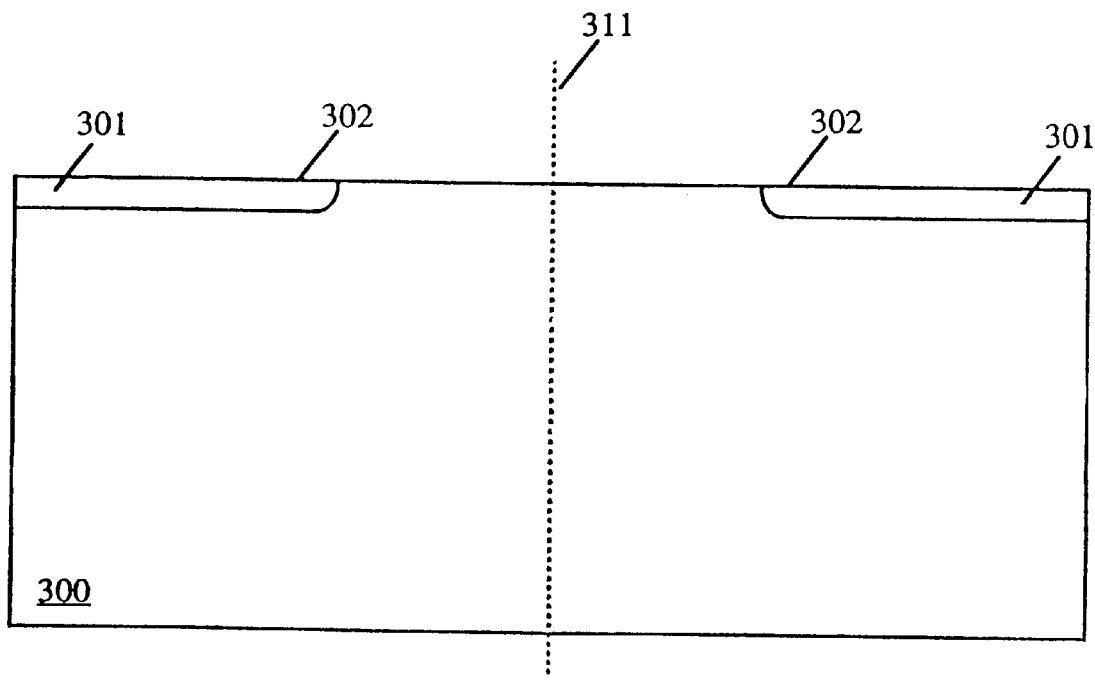
FIG. 16(b) shows a cross-sectional side view of a portion of the wafer of the previous figure showing the electronic circuit or component areas for two adjacent dies, each having a connection point.

Considering this fabrication process in more detail, FIG. 16(a) is a top view and FIG. 16(b) is an cross-sectional view of substrate wafer 300. Line 311 is one of the lines along which substrate wafer 300 will be separated into individual finished electronic devices—not merely die requiring a subsequent assembly step.

Generally, electronic circuits are formed within, or attached to, a square or rectangular region 301 that is replicated both horizontally and vertically, thus covering the top surface of substrate wafer 300. One edge of each electronic circuit region 301 is shown in FIG. 16(a), each having a connection point 302 within the circuit.

Substrate wafer 300, techniques for fabricating electronic circuits or discrete components using substrate wafer 300, and for placing electronic circuits or discrete electronic components on top of substrate wafer 300 are discussed above in connection with FIG. 3.

Figure 17:
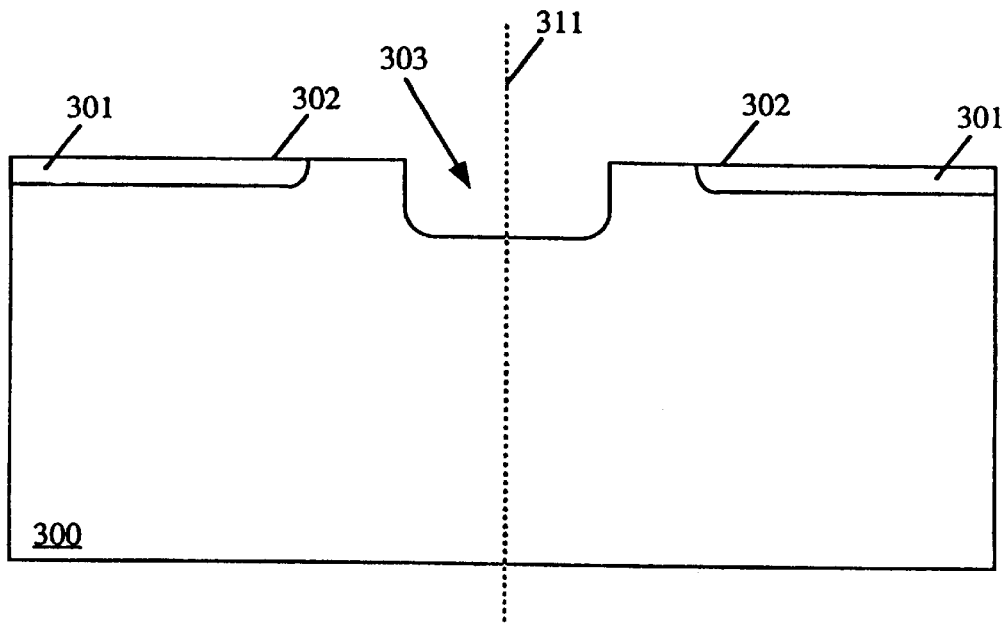
FIG. 17 shows a cross-sectional side view of the wafer portion of the previous figure after a trench has been etched in the wafer between the two electronic circuit areas.

As shown in FIG. 17, the first step in fabricating a contact on an encapsulant protrusion is to form a trench in substrate wafer 300 near, and possibly parallel to, the adjacent edges of electronic circuit regions 301. Trench 303 can be formed by any technique, such as but not limited to the following: photo-lithographically patterned wet chemical etching; dry plasma etching; mechanical micro machining; sawing; or the like.

Trench 303 is a relatively deep recess (200 micron s deep and 600 microns wide, for example) within substrate wafer 300. As will become clear, trench 303 must be formed deeper than the thickness of the substrate that will remain beneath electronic circuit region 301 in the finished device.

Figure 18:
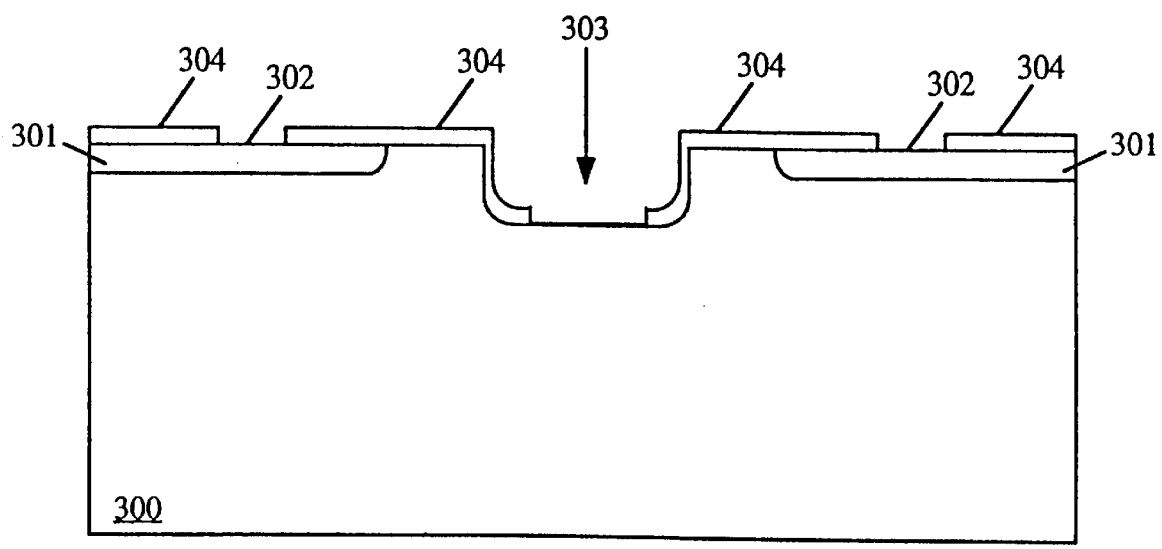
FIG. 18 shows a cross-sectional side view of the wafer portion of the previous figure after an insulator has been formed on selected portions of the top of the wafer according to a pattern.

As shown in FIG. 18, the next step in fabricating a contact for embodiments using a conductive substrate wafer 300, is to form insulation layer 304 (1 micron or less thick, for example) on selected regions of substrate wafer 300. Insulation layer 304 is formed in a pattern such that connection point 302 and a portion of trench 303 are not insulated. Insulation layer 304 is discussed above in connection with FIG. 5.

Figure 19:
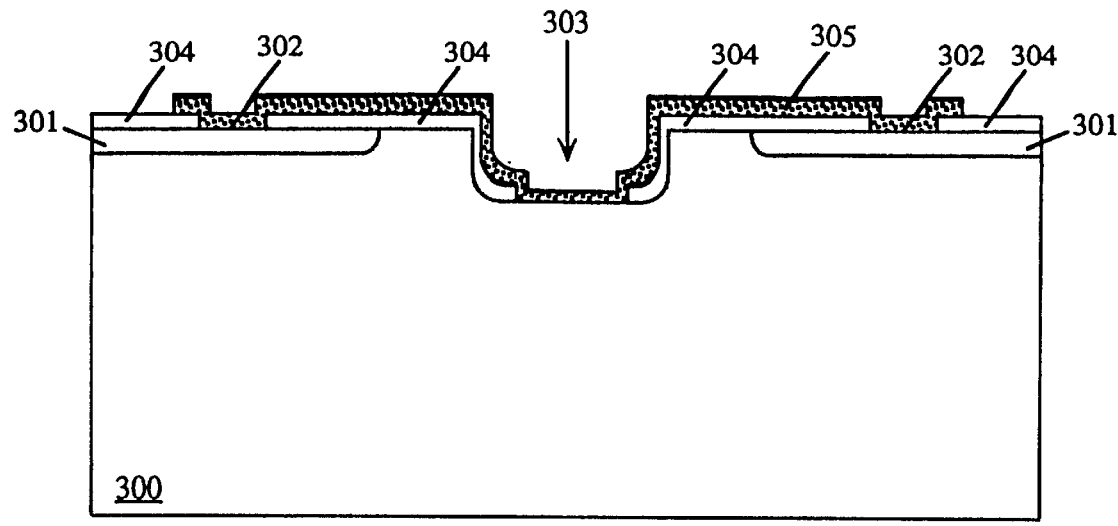
FIG. 19 shows a cross-sectional side view of the wafer portion of the previous figure after a gold wire has been formed on top of the wafer and the insulator.

As shown in FIG. 19, the next step in fabricating a contact is to form interconnect wire 305 (for example, 5 microns thick and at least 25 microns wide depending on the current capacity required) from connection point 302 within electronic circuit region 301 to the non-insulated portion of trench 303. Materials and processed used for interconnect wire 305 are discussed above in connection with FIG. 7.

Interconnect wire 305 can be of any width. Within the same device, there can be interconnect wires 305 of various widths, which as will be seen from the discussion below, results in contacts of various widths, though typically all contacts along the same edge of the device would have the same width.

For some uses of some types of electronic devices, it may be a significant advantage to be able to vary the contact's surface area. In the absence of this ability, if the current carrying capacity of a single contact is exceeded, then multiple contacts must be dedicated to carry the same signal or power-supply voltage level. Also, the ability to vary the contact's surface area may help reduce parasitic circuit elements such as resistance and inductance that can be introduced by a contact. This reduction might be a significant advantage in some cases, such as for power switching devices.

Figure 20:
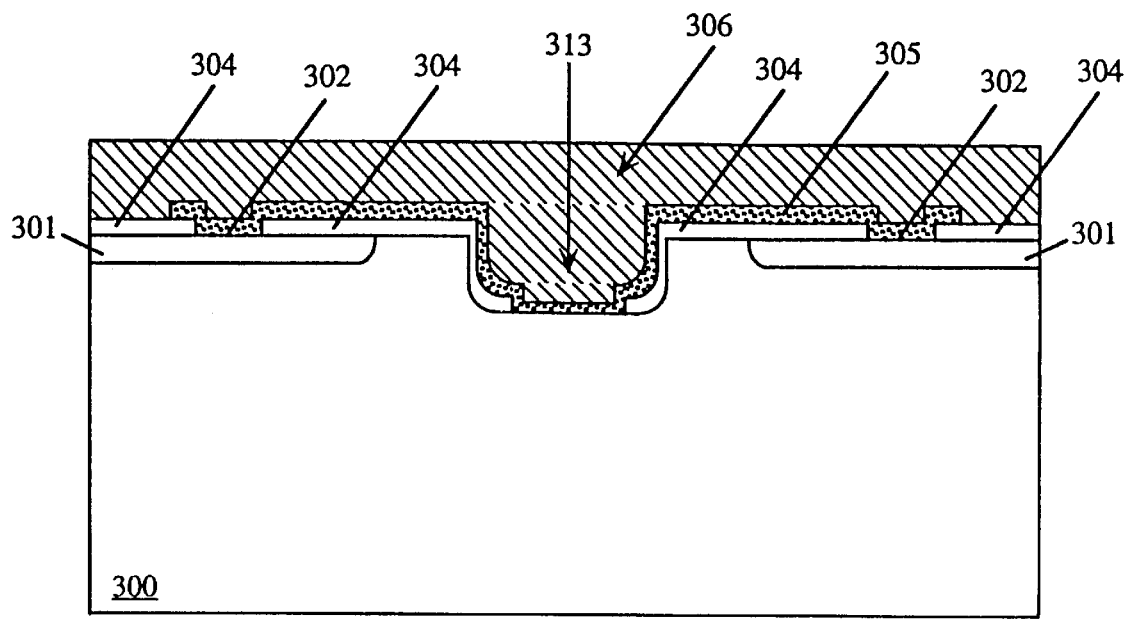
FIG. 20 shows a cross-sectional side view of the wafer portion of the previous figure after a relatively thick layer of epoxy has been applied to the top of the wafer, the insulator and the gold wire, which encapsulates them into a strong and rigid unit and which forms an encapsulant protrusion.

As shown in FIG. 20, the next step in forming a contact is to encapsulate substrate wafer 300, insulation layer 304, and interconnect wire 305. The top surfaces of these structures are covered with a relatively thick layer (150 microns thick, for example) of a strong and insulative encapsulant. The encapsulant fills trench 303, thus forming encapsulant protrusion 313. Suitable materials for and methods of forming encapsulant layer 306 are discussed above in reference to FIG. 7.

Figure 21:
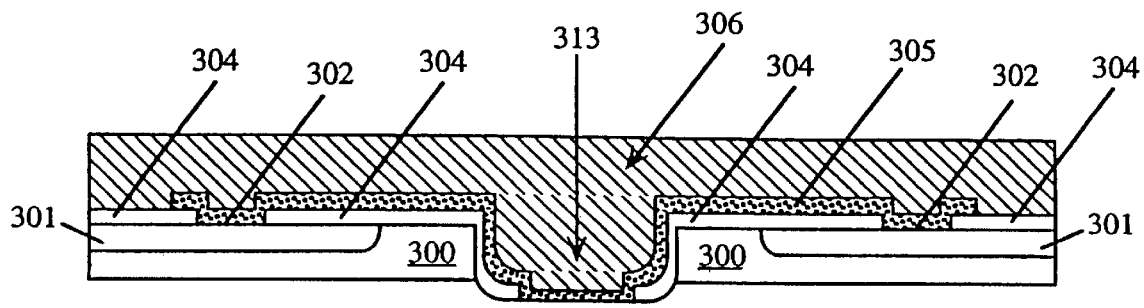
FIG. 21 shows a cross-sectional side view of the wafer portion of the previous figure after the wafer has been thinned from the bottom to expose the gold wire at the bottom of the encapsulant protrusion.

As shown in FIG. 21, the next step in fabricating a contact is to remove material from the bottom surface of substrate wafer 300 so as to reduce its thickness. Any method of removing substrate material from the back of substrate wafer 300 can be used, such as but not limited to the following: back planing, back lapping, sandblasting, grinding, wet chemical etching, dry plasma etching, combinations thereof or the like. The wafer must be thinned enough that interconnect wire 305 is exposed around at least a portion of the encapsulant trench. This thinning separates substrate wafer 300 into separate portions, each of which becomes the substrate for one of the finished electronic devices.

Optionally, the encapsulant protrusion can be separated into pads for each contact, or the electronic devices can be marked or tested while the devices are still attached to the wafer. These steps are discussed above in connection with the substrate-post embodiments of the invention.

Figure 22A:
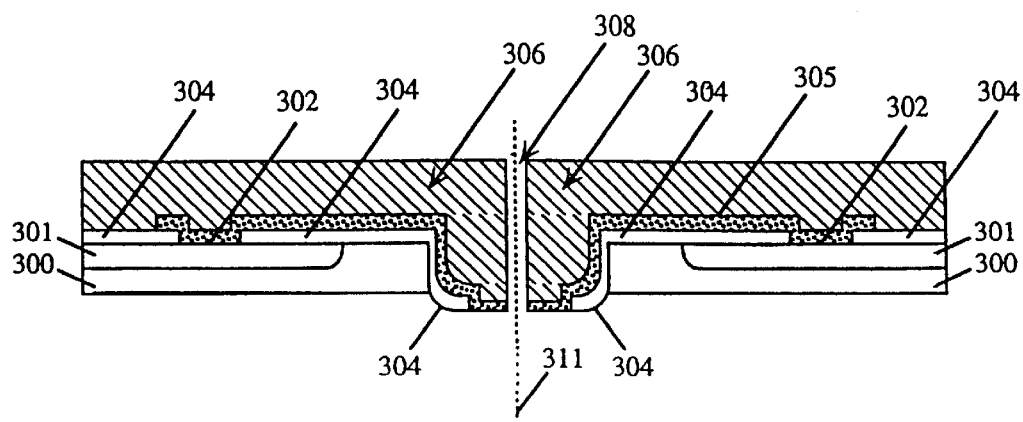
FIG. 22(a) shows a cross-sectional side view of the wafer portion of the previous figure after being sawed into two electronic devices, each with an attached contact.
Figure 22B:
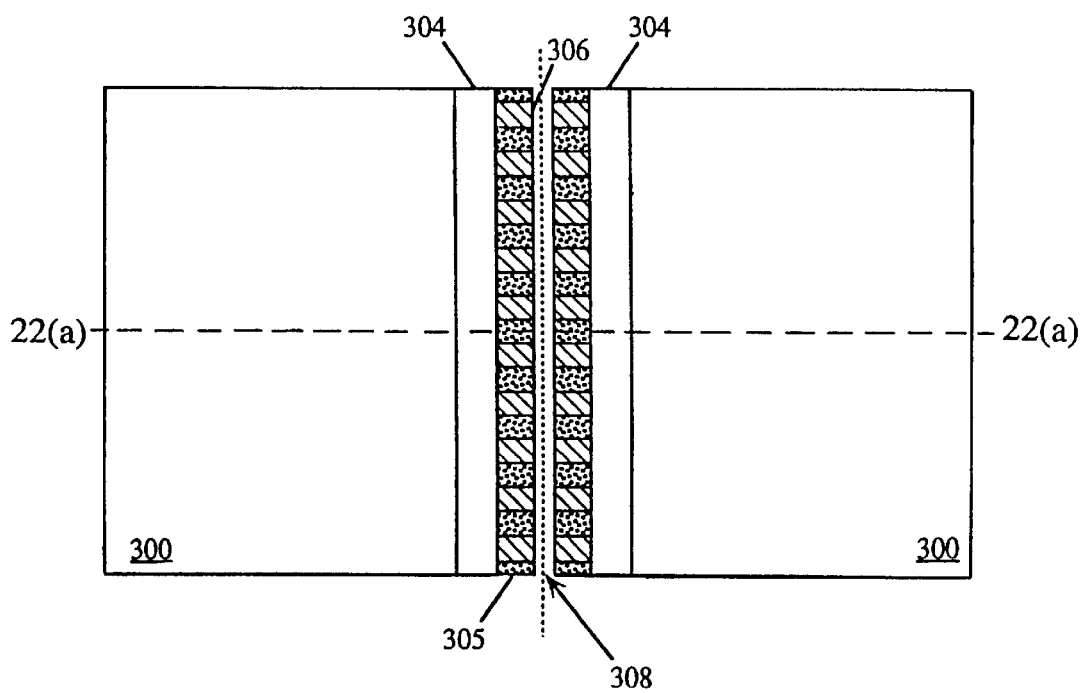
FIG. 22(b) shows a partial bottom view of the same two electronic devices, each with multiple contacts in a row along each edge.

The final step in fabricating a contact according to this embodiment is to separate substrate wafer 300 into individual electronic devices, as shown in FIG. 22. FIG. 22(*a*) is a cross sectional side view of the wafer of the previous figure after being sawed, etched, or otherwise separated into two finished devices, each with an attached contact. This separation forms the outside surface of the contact and completes the contact's fabrication. FIG. 22(*b*) is a bottom view of the same two devices of the previous figure, the previous figure being a cross section view taken along line 22(*a*). Each device has multiple contacts.

In some embodiments, the electronic device is now completely packaged, unlike those prior-art techniques in which wafers are separated into dies, which are subsequently assembled into packaged devices. Alternatively, additional test or marking steps might be required. Alternatively, additional device assembly steps might be required in embodiments where contacts on the bottom of the device as disclosed herein are combined with additional contacts on the top of the device that are fabricated using other techniques. For some uses of some types of electronic devices, it is a potential advantage that contacts as disclosed herein can be combined in the same electronic device with top-side connections.

Figure 23A:
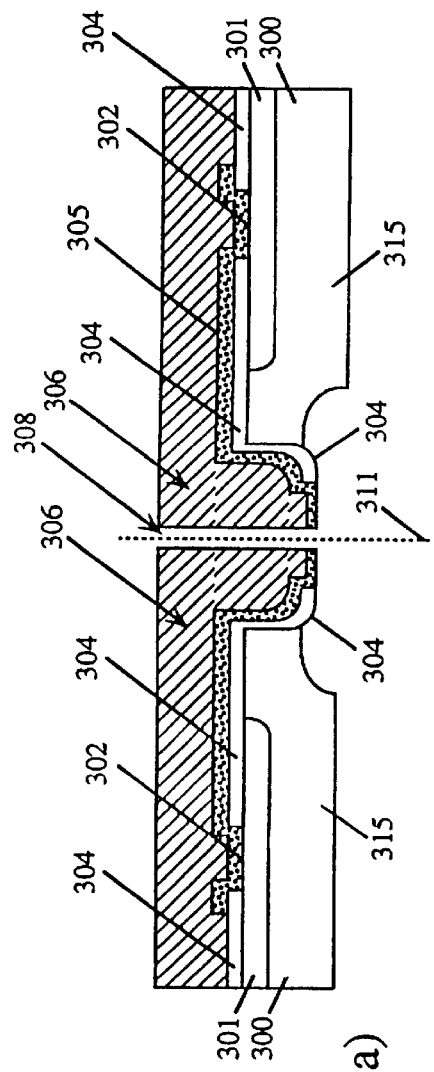
FIG. 23(a) shows a cross-sectional side view of a wafer portion comparable to that of the previous figure but with a bottom substrate surface that drops down to circuit-board level to transfer heat generated in the electronic device to the circuit board.
Figure 23B:
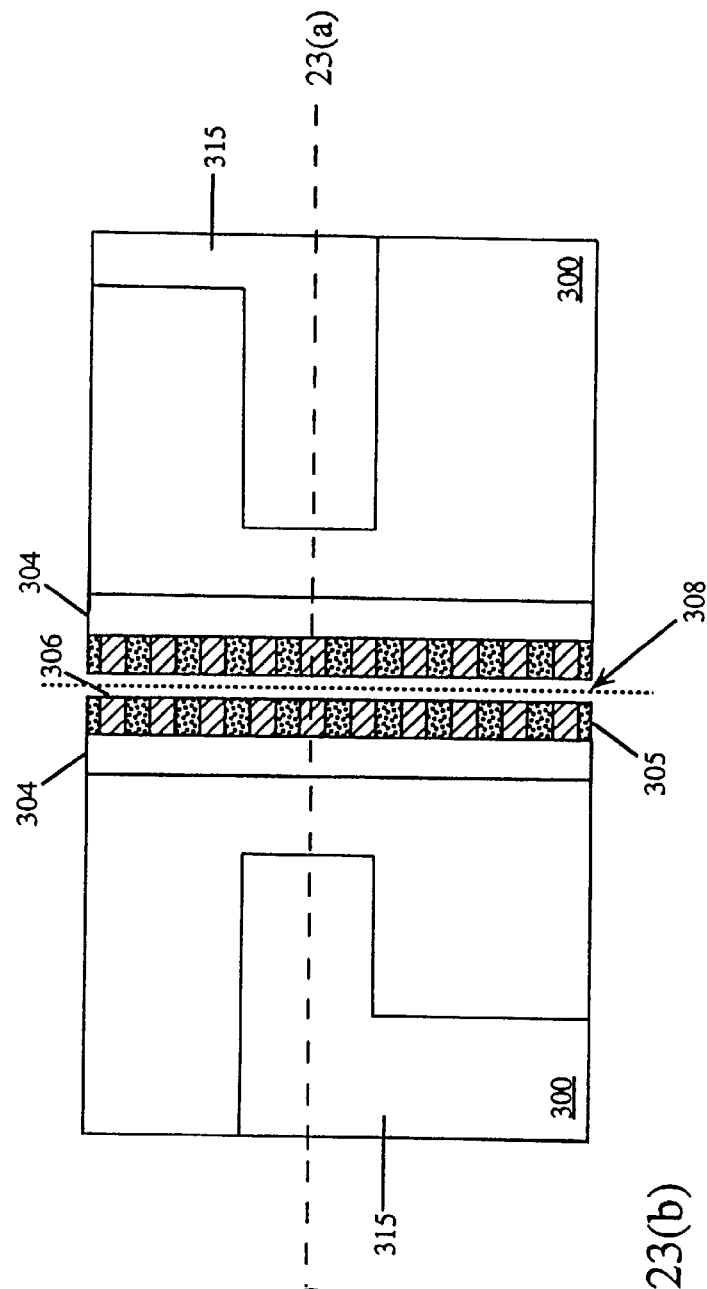
FIG. 23(b) shows a bottom view of the same electronic device, which has an irregularly shaped drip bottom, perhaps dropping beneath those portions of the device that generate significant heat.

FIG. 23 shows an electronic device similar to that of the previous figure, except that it includes drop bottoms 315. Drop bottoms 315 are protruding portions of substrate 300. They have a bottom surface approximately co-planar with the bottom of the contacts of the finished electronic device.

Drop bottoms 315 are formed by selectively not thinning portions of the bottom of substrate portion 300*a* during at least a portion of the thinning step discussed above in connection with FIG. 21. This thinning step can take the form of two thinning steps:

1. A first thinning step that uniformly reduces the wafer to a thickness appropriate for the bottom surface of drop bottoms 315 (similar to the thinning step described above in connection with FIG. 8 that forms the bottom surface of substrate posts); and
2. A second thinning step that selectively reduces the thickness of the substrate so as to expose the portion of wires 305 at the bottom of encapsulant protrusion 313 but does not thin the portions of the substrate bottom that form drop bottoms 315.

Each drop bottom 315 connects with the circuit board or the like to which the electronic device is attached, so that heat can be transferred out of the electronic device and into the circuit board, where the heat might be more easily dissipated without overheating the device.

FIG. 23(*b*) is a bottom view of the electronic device and FIG. 23(*a*) is a cross section taken along line 13(*a*). As shown here, each drop bottom 315 has an irregular shaped bottom surface, perhaps designed so that drop bottom 315 protrudes beneath those portions of the electronic circuit or device that produce substantial heat. Drop bottoms 315 could have any shape and could cover more or less area depending on the heat dissipation needs of the electronic device and the heat absorption, transfer and dissipation characteristics of the circuit board or other apparatus to which the device is mounted.

An alternative embodiment also uses inside-wrapped contacts on an encapsulant protrusion, but uses an insulative substrate, including but not limited to gallium arsenide. As mentioned above, gallium arsenide is a substrate that, unlike silicon, does not significantly conduct electricity unless doped. Thus, patternable insulator layer 304 is not needed in the embodiments where substrate wafer 300 is made of gallium arsenide. The step of adding a patternable insulator described above in reference to FIG. 18 is not needed. Rather, interconnect wire 305 can be insulated from substrate wafer 300 by simply not doping the substrate in the areas where there is to be no electrical conductivity.

FIG. 24 shows a contact embodiment that has an insulative substrate and an encapsulant protrusion. Its major difference from the conductive-substrate, encapsulant-protrusion embodiment of FIG. 22 is that insulation layer 304 is missing. If the insulative substrate is gallium arsenide, then connection point 310 is formed by doping the gallium arsenide so that it becomes conductive where it will electrically connect to interconnect wire 305.

FIG. 24(*a*) is a side view, taken along a cross section shown by line 24(*a*), of two electronic devices and contacts made using a gallium arsenide substrate for which no insulation layer is necessary. FIG. 24(*b*) is a bottom view of a portion of these two devices, each with multiple contacts.

Figure 25A:
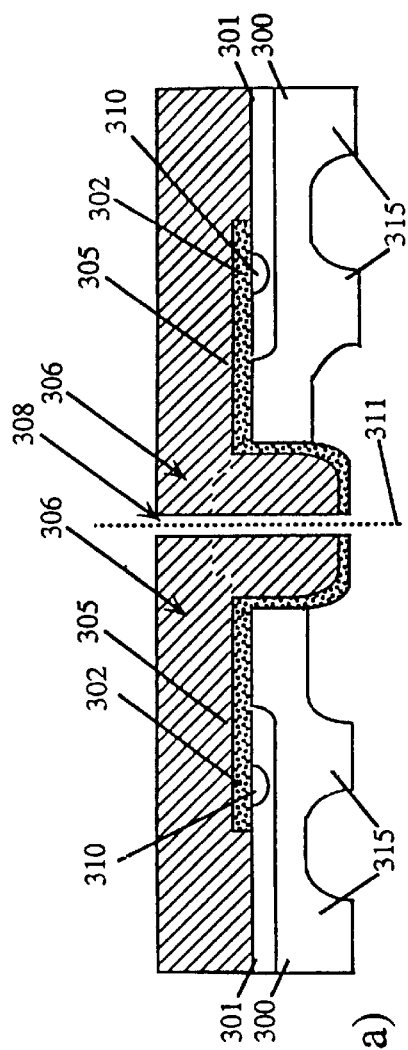
FIG. 25(a) shows a cross-sectional side view of a wafer portion comparable to that of the previous figure but with a bottom substrate surface that drops down to circuit-board level to transfer heat generated in the electronic device to the circuit board.
Figure 25B:
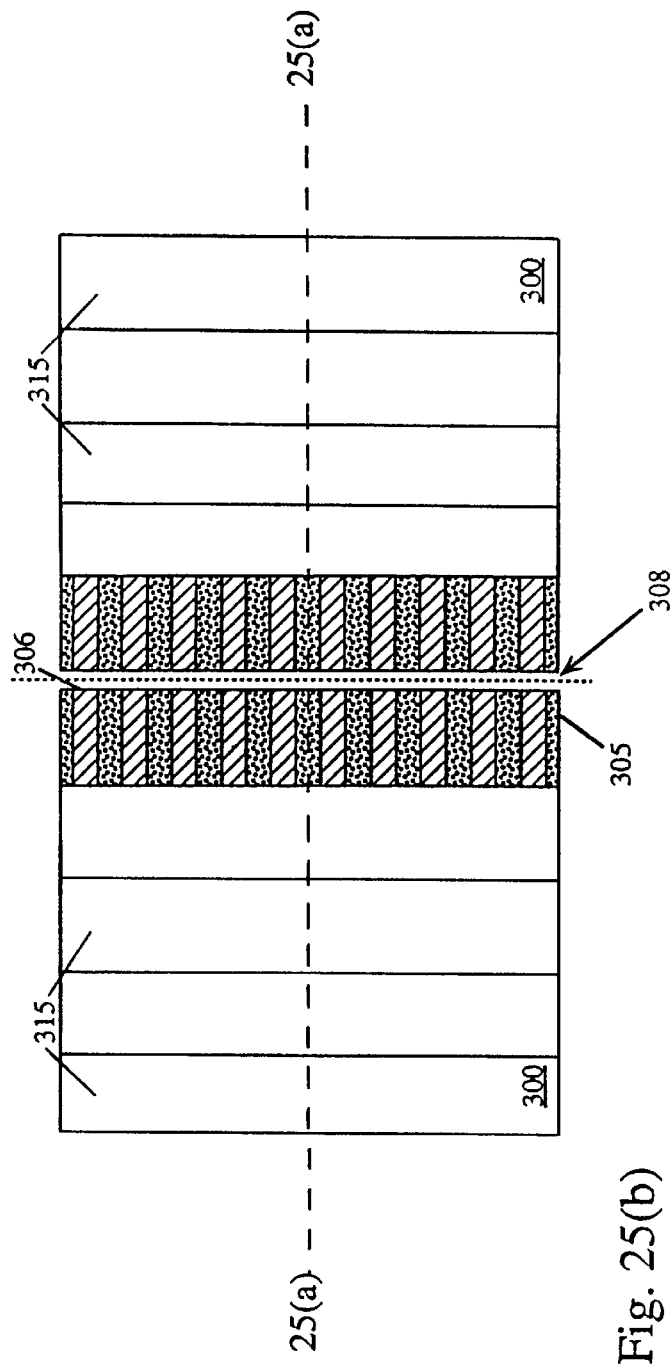
FIG. 25(b) shows a bottom view of the same electronic device, which has a ribbed drop bottom.

Another alternative embodiment includes a drop bottom. FIG. 25 shows electronic devices similar to that of the previous figure, except they include drop bottoms 315. Drop bottoms 315 are protruding portions of substrate 300. They are formed by selectively not thinning portions of the bottom of substrate portion 300*a* during at least a portion of the thinning step discussed in connection with FIG. 23.

FIG. 25(*b*) is a bottom view of the electronic device and FIG. 25(*a*) is a cross section taken along line 13(*a*). As shown here, drop bottom 315 has a ribbed bottom surface where vertical ribs or regions of drop bottom 315 alternate with vertical regions where the bottom of substrate portion 300*a* has been thinned so as to provide a stand off from the circuit board to which the electronic device is attached. Alternatively, there could be a single rib or strip down approximately the center of the electronic device. Drop bottoms 315 could have any shape and could cover more or less area depending on the heat dissipation needs of the electronic device and the heat absorption, transfer and dissipation characteristics of the circuit board or other apparatus to which the device is mounted.

The contact according to encapsulant protrusion embodiments comprises:

1) The portion of encapsulant layer 306 that protrudes below the bottom of substrate 300;
2) The portion of insulation layer 304 that protrudes below the bottom of substrate 300; and
3) The portion (50 microns by 50 microns, for example) of interconnect wire 305 that protrudes below the bottom of substrate 300.

The relative simplicity of this contact may help to minimize parasitic elements being introduced into the circuit in which the contact is used. For some uses of some types of devices, including but not limited to power-switching devices and the like, this may be a significant advantage.

Like the above described embodiments with substrate posts, interconnect wire 305 wraps around the inside surface of the encapsulant extension.

The contacts of the encapsulant-protrusion embodiments are suitable for connecting with a circuit board or the like using a variety of techniques, such as but not limited to surface mount soldering, gold compression bonding, conductive epoxy or the like.

A potential advantage of the embodiments with contacts on an encapsulant protrusion is higher wafer packing density. That is, the area of substrate wafer 300 that is used to form contacts might be reduced, even over the reduction achieved in the embodiments with substrate posts. Such a reduction in area may allow more replications of electronic circuit regions 301 to fit on a wafer, and thus may reduce manufacturing costs per device.

In some embodiments, interconnect wire 305 is relatively pure gold. Thus, the contacts formed by the above-described process are suitable for gold compression bonding. That is, they can be applied to relatively pure gold wires patterned on a rigid material, such as but not limited to glass. When applied with sufficient force, the gold contacts both electrically connect and mechanically bond to the gold wires on the glass. This could also be done using other conductive materials for interconnect wire 305 and the external wires that are susceptible to compression bonding.

A potential advantage of the compression bonding embodiments is that a very fine inter-contact pitch might be achieved. For example, pitches down to 75 microns might be achievable. Such a fine inter-contact pitch may be advantageous for some uses of some types of devices, such as but not limited to control circuits for liquid crystal displays (LCDs) and the like.

Inside-Wrapped Contacts On an Encapsulant Protrusion with a Contact Layer

Contacts comprising an encapsulant protrusion, a wire and a contact layer, in which the wire and the contact layer run over the encapsulant protrusion are shown in FIG. 27 through FIG. 29. How such contacts are fabricated is shown in FIG. 16 through FIG. 21 and FIG. 26.

A brief description of how such a contact can be fabricated is as follows:

1) A relatively large trench is formed in the top surface of a substrate, such as but not limited to a semiconductor wafer. The trench may be located near the edge of an electronic circuit or component, such as but not limited to an integrated circuit. The circuit or component is formed using the substrate or is attached to the substrate.

2) Optionally, an insulation layer is formed that has a through hole over a connection point within the circuit and that ends part way through the trench.

3) A wire is formed that runs from the connection point into the trench.

4) The top of the substrate is encapsulated, thus forming an encapsulant protrusion in the trench. Optionally, the encapsulant includes a cap layer.

5) The substrate is thinned from the bottom, thus exposing part of the bottom surface of the wire on the encapsulant protrusion.

6) A contact layer is formed on the bottom surface of the wire on the encapsulant protrusion.

7) Optionally, contact pads are defined by sawing or etching, thus forming the side surfaces of the contact pads.

8) Optionally, the top surface of the electronic devices are marked, so as to identify the part type and the orientation of pin number 1.

9) The wafer is diced, thus forming the outside surface of the substrate post. For some embodiments, this completes the fabrication of the electronic device.

10) Optionally, the electronic devices are tested while still attached to a carrier.

Figure 26:
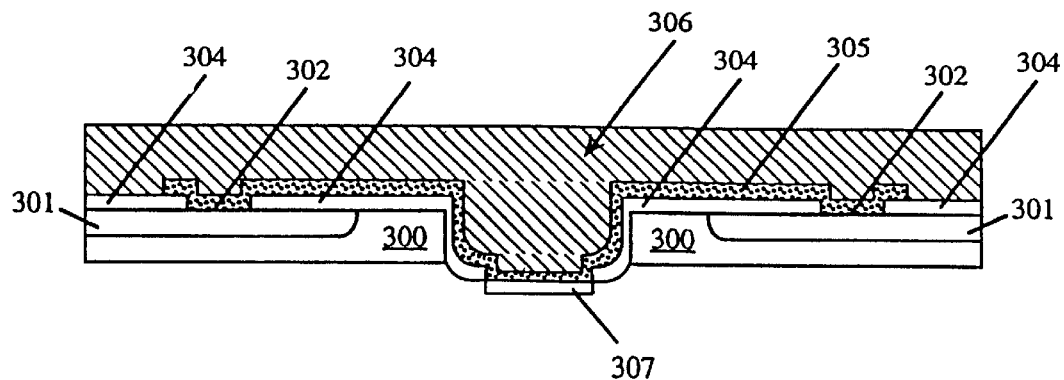
FIG. 26 illustrates a cross-sectional side view according to an alternative process in which the wafer portion of FIG. 21 next has a contact wire formed beneath the exposed gold wire.

A description of parts of this fabrication process can be found in reference to FIG. 16 through FIG. 21 above. Continuing on, the bottom of the wafer shown in FIG. 21 is selectively coated with lead wires or contact layer 307 (for example, 6 microns thick with each contact being 100 microns wide by 150 microns long), as shown in FIG. 26. Contact layer 307 is formed on top of the exposed portion of interconnect wire 305 so as form the bottom surface of the contact being fabricated. Contact layer 307 is discussed above in connection with FIG. 10.

Optionally, the encapsulant protrusion can be separated into pads for each contact, or the electronic devices can be marked or tested while the devices are still attached to a carrier. These steps are discussed above in connection with the substrate-post embodiments of the invention.

Figure 27A:
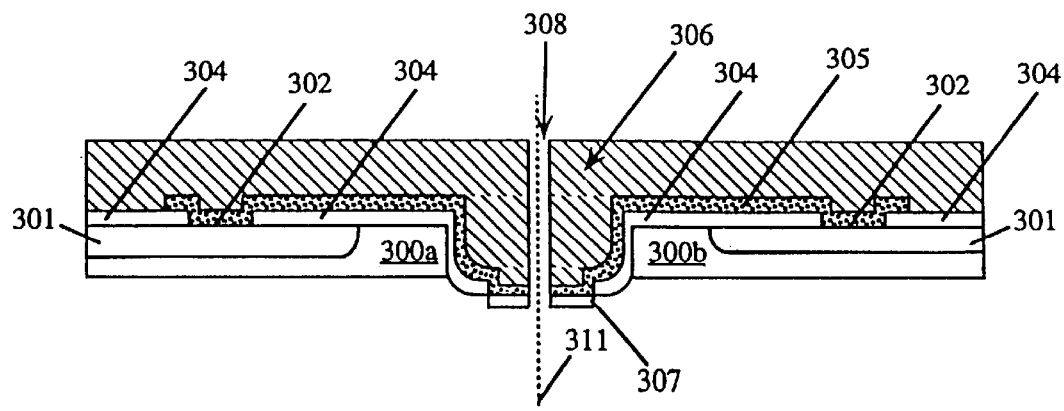
FIG. 27(a) shows a cross-sectional side view of the wafer portion of the previous figure after being sawed into two electronic devices, each with an attached contact.
Figure 27B:
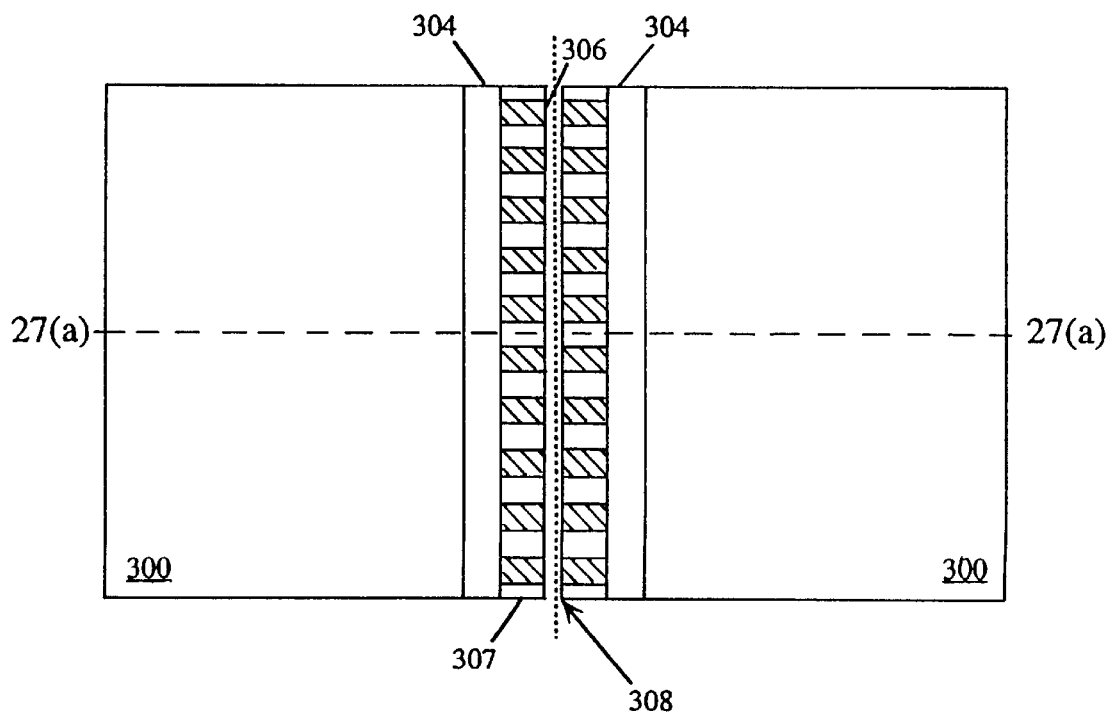
FIG. 27(b) shows a partial bottom view of the same two electronic devices, each with multiple contacts in a row along each edge.

The final step in fabricating a contact according to this embodiment, is to separate substrate wafer 300 into completed electronic devices, each with a set of attached contacts, as shown in FIG. 27(a). The separation formed by this sawing, etching or the like finishes the formation of the contact and of the electronic device. FIG. 27(b) shows a bottom view of the same two die of the previous figure, the previous figure being a cross section view taken along line 27(a). Each die has multiple contacts.

In some embodiments, the electronic device is now completely packaged, unlike those prior-art techniques in which wafers are separated into dies, which are subsequently assembled into packaged devices. Alternatively, additional test or marking steps might be required. Alternatively, additional device assembly steps might be required in embodiments where contacts on the bottom of the device as disclosed herein are combined with additional contacts on the top of the device that are fabricated using other techniques. For some uses of some types of electronic devices, it may be an advantage that contacts as disclosed herein can be combined in the same electronic device with top-side connections.

FIG. 28 shows an electronic device similar to that of the previous figure, except that the device includes drop bottoms 315. Drop bottoms 315 are protruding portions of substrate 300. They are formed by selectively not thinning portions of the bottom of substrate portion 300a during at least part of the thinning step discussed in connection with FIG. 21

Figure 28A:
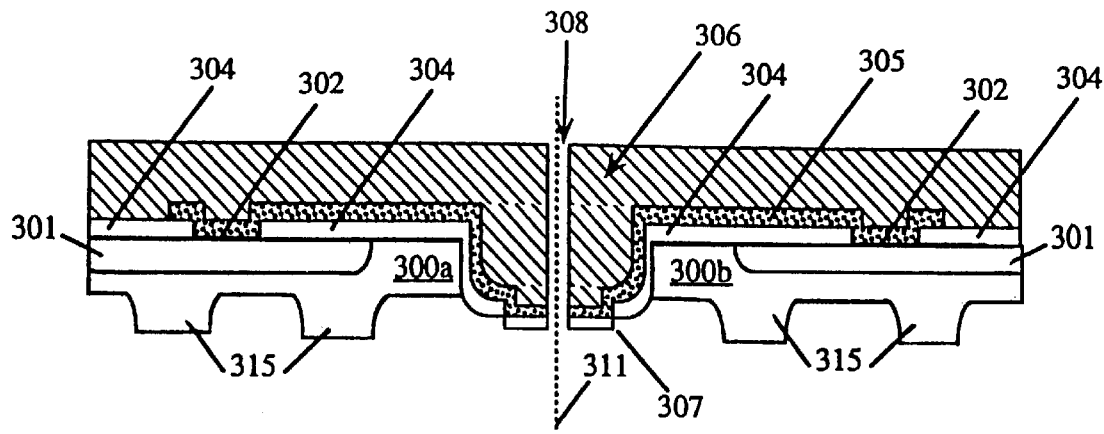
FIG. 28(a) shows a cross-sectional side view of a wafer portion comparable to that of the previous figure but with a bottom substrate surface that drops down to circuit-board level to transfer heat generated in the electronic device to the circuit board.
Figure 28B:
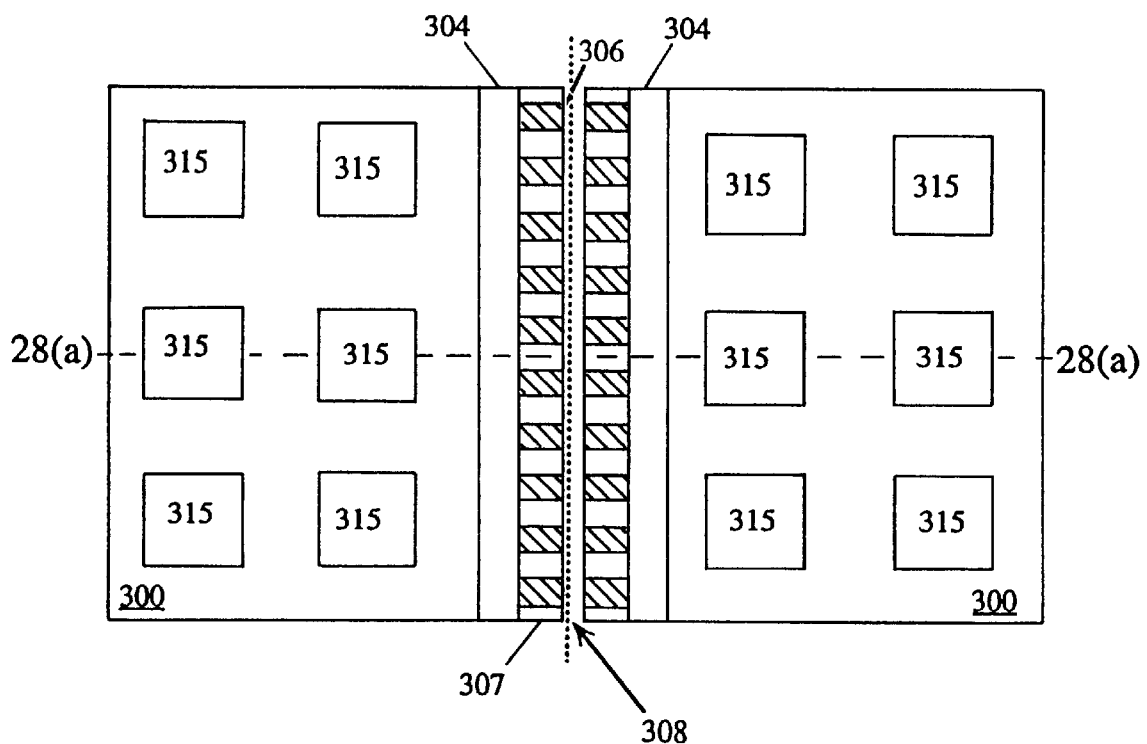
FIG. 28(b) shows a bottom view of the same electronic device, which has a drop bottom that includes multiple pillars.

FIG. 28(b) is a bottom view of the electronic device and FIG. 28(a) is a cross section taken along line 13(a). As shown here, drop bottoms 315 are square pillars that alternate with regions where the bottom of substrate portion 300a has been thinned so as to provide a standoff from the circuit board to which the device is attached. Drop bottoms 315 could have any shape and could cover more or less area depending on the heat dissipation needs of the electronic device and the heat absorption, transfer and dissipation characteristics of the circuit board or the like to which the device is mounted.

Figure 29A:
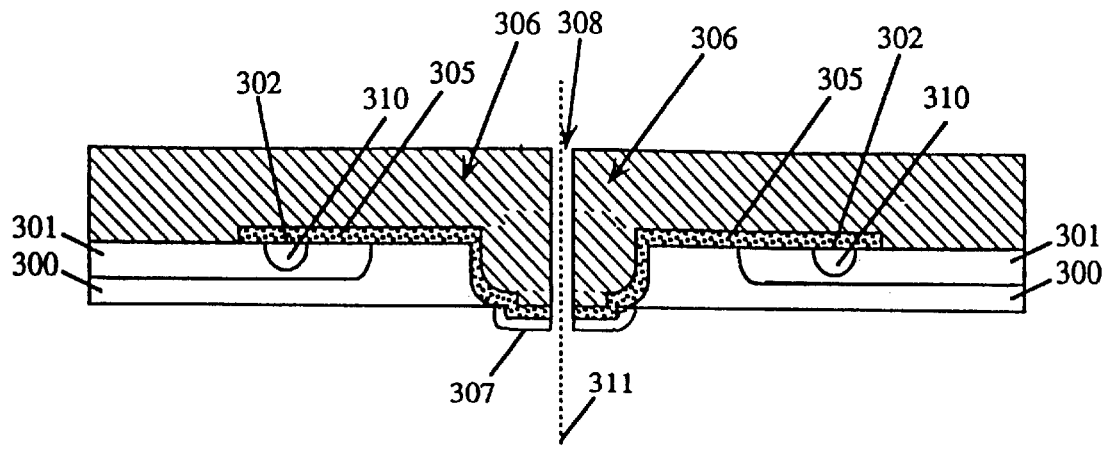
FIG. 29(a) shows a cross-sectional side view of two electronic devices and contacts comparable to those of FIG. 27, but made using a gallium arsenide substrate wafer for which no insulator is necessary.
Figure 29B:
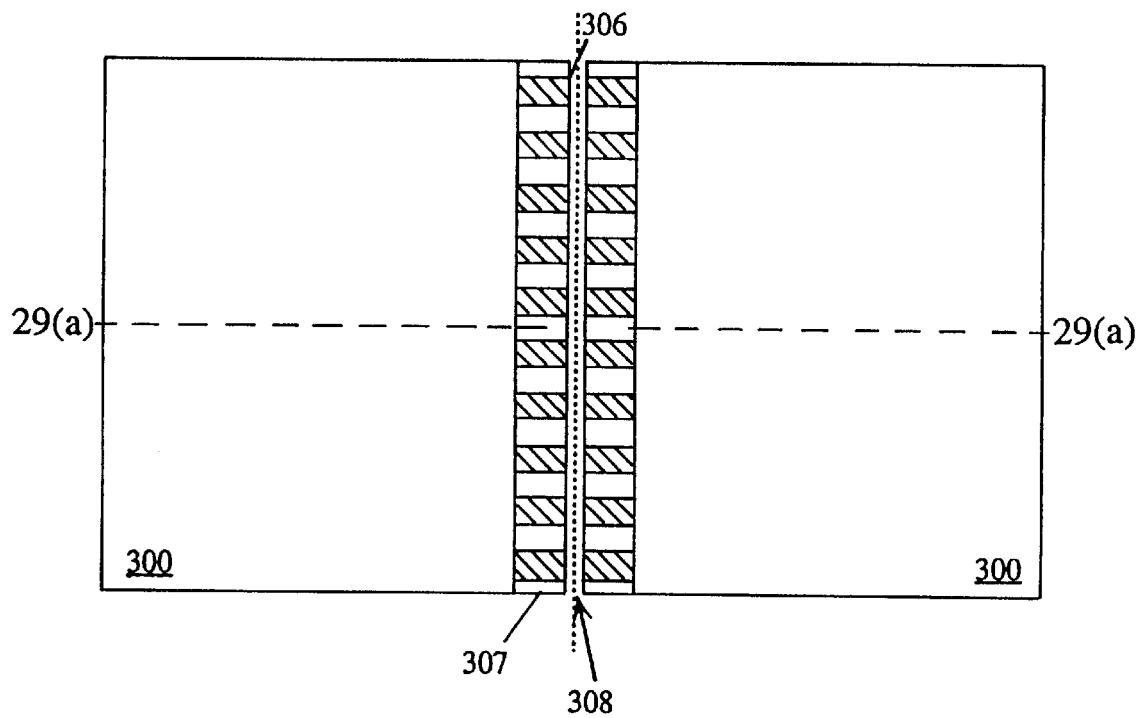
FIG. 29(b) shows a partial bottom view of these two electronic devices, each with multiple contacts.

FIG. 29 shows a contact according to embodiments that use an insulative substrate and contact leads on an encapsulant protrusion. FIG. 29(a) is a side view, taken along a cross section shown by line 29(a), of two dies and contacts made using a gallium arsenide substrate wafer for which no insulation layer is necessary. FIG. 29(b) is a bottom view of these two substrate die, each with multiple contacts.

The major difference from the silicon-based, encapsulant-protrusion, contact layer contact of FIG. 27 is that insulation layer 304 is missing. The major difference from the insulative, encapsulant-protrusion contact of FIG. 24 is that contact layer 307 is present. If the insulative substrate is gallium arsenide, connection point 310 is formed by doping the gallium arsenide so that it becomes conductive where it will electrically connect to interconnect wire 305.

The process required to produce a contact according to this insulative substrate embodiment is even simpler than that disclosed for conductive substrates, which may result in advantages such as reduced cost and higher yield. Also, the resulting contact has even fewer elements than for conductive substrates, which may help improve the reliability of the contact.

The contact of the encapsulant-protrusion embodiments with a contact layer comprises:

1) the portion of encapsulant layer 306 that protrudes below the bottom of substrate 300;
2) the portion of insulation layer 304 that protrudes below the bottom of substrate 300;
3) the portion of interconnect wire 305 that protrudes below the bottom of substrate 300; and
4) contact layer 307.

The relative simplicity of this contact may help to minimize parasitic elements being introduced into the circuit in which the contact is used. For some uses of some types of devices, including but not limited to power-switching devices and the like, this may be a significant advantage.

Like the embodiments described above, interconnect wire 305 wraps around the inside surface of the encapsulant protrusion.

The contacts of the encapsulant-protrusion embodiments are suitable for connecting with a circuit board or other apparatus using a variety of techniques, such as but not limited to surface mount soldering, gold compression bonding, epoxy, conductive epoxy or the like.

A potential advantage of the embodiments with an encapsulant protrusion and a contact layer is that the contact layer facilitates connecting the electronic device in a variety of ways. For example, contact layer 307 might be used advantageously in embodiments where interconnect wire 305 is made of gold and the electronic device is to be soldered. Gold dissolves in ordinary solders, thus contaminating the mix of metals in the solder. Even special solders for gold may be problematic. In such embodiments, contact layer 307 can be made of an easily solderable metal, as described above. In other embodiments, interconnect wire 305 might be something other than gold and contact layer 307 might be gold where a gold outer contact is desired for reasons such as such as, but not limited to, compression bonding, corrosion resistance and the like.

Inside-Wrapped Contacts With Drop Bottoms

FIG. 13(*b*), FIG. 23(*b*), FIG. 25(*b*); and FIG. 28(*b*) show contact embodiments that include at least one drop bottom 315. Drop bottom 315 is a protruding portion of substrate 300. Drop bottom 315 has a bottom surface approximately co-planar with the bottom of the contacts of the finished electronic device.

Drop bottom 315 is formed by selectively not thinning portions of the bottom of substrate portion 300*a* during at least part of the thinning step that exposes the wire on the bottom of the encapsulant protrusion. Forming drop bottom 315 sometimes requires a first thinning step that forms the bottom surface of drop bottom 315, followed by a second selective thinning step that exposed the wire without further thinning drop bottom 315.

Drop bottom 315 mechanically connects with the circuit board, glass plate, or the like to which the electronic device is attached, so that heat can be transferred out of the electronic device and into the larger system, where the heat might be more easily dissipated without overheating the device. Optionally, drop bottom 315 can electrically connect to the circuit board and can be used to supply the substrate voltage or signal for the device.

Although it is only illustrated herein in connection with a selected subset of contact types or embodiments, drop bottom 315 can be employed with every type or embodiment of contact described herein.

Drop bottom 315 is been described herein as having a variety of shapes:

1) a square or rectangle large enough to cover most of the bottom surface of the electronic device, as shown in FIG. 13(*b*);
2) an irregular shape, perhaps covering the portions of the electronic device that generate significant heat; as shown in FIG. 23(*b*);
3) ribs, as shown in FIG. 25(*b*); and
4) pillars, as shown in FIG. 28(*b*).

Drop bottom 315 could take on any shape including but limited to the above, horizontal ribs, vertical ribs, angled ribs, a single rib or wide strip down the middle of the device, combinations thereof and patterns thereof.

The shape of drop bottom 315 and the number of drop bottoms 315 in a device are design alternatives that can be chosen taking into account the size of the electronic device, the heat generation characteristics of the electronic device, the heat absorption characteristics of the circuit board or other apparatus to which the electronic device is attached and the characteristics of the method of attaching the electronic device to the circuit board. For example, for a small device, a square or rectangle large enough to cover most of its bottom surface might be the simplest and most reliable, whereas for a large device such a drop bottom might introduce thermal expansion problems or solder flow problems that could be avoided by a ribbed or pillared drop bottom.

Any shapes or number of drop bottoms 315 could be used in conjunction with any contact embodiment described herein.

Described herein are several methods for fabricating several different types of contacts for electrical and electronic devices. The embodiments described can be employed in ways that potentially realize one or more significant advantages, including but not limited to short and simple fabrication processes, simple and reliable contacts, high wafer packing density, and contacts with advantageous physical and electronic properties that are applicable for use with varied types of electronic devices.

The processes of fabricating contacts disclosed herein can potentially be advantageously short and simple. Shorter and simpler fabrication processes may decrease device manufacturing cost and increase manufacturing yields, i.e. the percentage of devices fabricated that actually function as specified. In some embodiments, an electronic device can be completely packaged using wafer fabrication processes, unlike those prior-art techniques in which wafers are separated into dies, which are subsequently assembled into packaged devices. Further, the finished electronic devices might be tested while still in wafer form. Alternatively, the finished devices might be tested after being separated, and the typical prior-art wafer testing step might be eliminated. Further, the processes disclosed for a contact with an insulative substrate, such as gallium arsenide, is even simpler than the processes disclosed for conductive substrates, such as silicon, which might further enhance these advantages.

The contacts disclosed herein can potentially be advantageously simple, mechanically rugged and sturdy, and contain relatively few elements. Thus, they might be inherently reliable. Further, the contacts disclosed using an insulative substrate, such as gallium arsenide, have even fewer elements compared to those described for conductive substrates, such as silicon, and thus might be even more inherently reliable.

Wafer packing density can potentially be advantageously increased over those prior-art techniques that use substrate area to fabricate contacts. The area of a substrate wafer dedicated to forming contacts might be less; thus more replications of the electronic circuit or discrete component may fit on a wafer; thus manufacturing costs per device may be lower.

The contacts disclosed herein can potentially have advantageous physical properties, which may make them advantageously adaptable for use with electronic devices of different types. An inter-contact pitch compatible with 300-micron surface mount techniques is easily achieved. A very fine inter-contact pitch might be possible (for example, down to 75 microns), at least for encapsulant-protrusion embodiments used in conjunction with gold compression bonding. In various embodiments, the contact layer can be formed of an easily solderable material, or formed of gold, or formed of whatever material is suited for the particular mounting technique to be employed with the completed electronic device. Contacts formed on the bottom surface of the substrate as described herein might be combined in the same electronic device with contacts or pads on the top surface of the substrate; thus increasing the number of contacts per device and allowing flexibility in the types of contacts a device uses.

The contacts disclosed herein can potentially have advantageous electronic properties, which may make them advantageously adaptable for use with electronic devices of different types. The contact's bottom surface dimensions can vary from contact to contact, which may reduce or eliminate the need to dedicate multiple contacts to carrying the a signal or a power supply voltage that requires substantial current. Both because of their varying sizes and because of their relative simplicity, the resulting contacts may help to minimize parasitic circuit effects, which may be advantageous for uses such as power switching devices and the like.

Additionally, devices fabricated according to the techniques described herein can potentially provide separate, isolated substrates for various portions of the electronic circuitry that they contain.

In the foregoing specification, the present invention has been described with reference to specific exemplary embodiments thereof. It will, however, be evident that various modifications and changes may be made to those described herein without departing from the broader spirit and scope of the invention as set forth in the following claims. The specification and drawings are, accordingly, to be regarded in an illustrative rather than a restrictive sense.

What is claimed is:

1. A method of fabricating a contact for an electronic device, comprising:
   forming a trench in the top surface of a substrate, the substrate having an electronic circuit with a connection point;
   forming an upper wire above the substrate extending from the connection point and into the trench;
   forming an encapsulant layer above the upper wire and the substrate, the encapsulant layer forming a protrusion in the trench;
   thinning the bottom surface of the substrate under at least a portion of the encapsulant protrusion to expose at least a portion of the bottom surface of the upper wire and to form a substrate post; and
   forming a lower wire between the exposed portion of the upper wire and the substrate post.

2. The method of claim 1, further comprising:
   forming an insulation layer between the substrate and the upper wire, the insulation layer having a contact through-hole at the connection point, leaving a portion of the trench uncovered.

3. The method of claim 1, wherein the trench forming step includes cutting a starter trench and thereafter etching the starter trench to form the trench.

4. The method of claim 1, wherein the thinning step is patterned so as to leave a portion of the bottom surface of the substrate substantially co-planar with the lower wire.

5. The method of claim 1, wherein the substrate is formed of material selected from the group consisting of silicon, gallium arsenide, silicon germanium, silicon carbide, gallium phosphide, ceramic materials, sapphire and quartz.

6. The method of claim 1, wherein the electronic circuit is selected from the group consisting of an integrated circuit fabricated using the substrate, an electronic circuit fabricated using the substrate, an active discrete electronic component fabricated using the substrate, a passive discrete electronic component fabricated using the substrate, an integrated circuit attached to the substrate, an electronic circuit attached to the substrate, an active discrete electronic component attached to the substrate, and a passive discrete electronic component attached to the substrate.

7. The method of claim 1, wherein the upper wire is formed of material selected from the group consisting of gold, silver, copper, aluminum, nickel and layers thereof.

8. The method of claim 1, wherein the encapsulant is formed of material selected from the group consisting of epoxy, plastic, glass, polymide resin, Teflon, silicon oxide, silicon nitride, silicon, polysilicon, amorphous silicon, aluminum, diamond, and layers thereof.

9. The method of claim 1, wherein the lower wire is formed of material selected from the group consisting of gold, silver, nickel, nichrome-gold, nichrome-nickel, nickel-arsenic-gold, nickel-arsenic, nickel-gold, gold-tin-oxide, palladium-silicide, titanium, tungsten, titanium-tungsten, indium titanium oxide, aluminum, copper, platinum, alloys thereof, and layers thereof.

10. The method of claim 2, wherein the insulation layer is formed of material selected from the group consisting of silicon oxide, silicon nitride, aluminum oxide, polymide resins, epoxy, acrylics, patternable plastics, mixtures thereof, and layers thereof.

11. A method of fabricating a contact for an electronic device, comprising the steps of:
    forming a trench in the top surface of a substrate, the substrate having an electronic circuit that includes a connection point;
    forming a wire above the substrate, the wire running from the connection point into the trench;
    forming an encapsulant layer above the wire and the substrate, the encapsulant layer forming a protrusion in the trench; and
    thinning the bottom surface of the substrate under at least a portion of the encapsulant protrusion, the thinning exposing at least a portion of the bottom surface of the wire.

12. The method of claim 11, further comprising:
    forming an insulation layer located between the substrate and the wire, the insulation layer having a contact through-hole at the connection point and leaving uncovered at least a portion of the trench.

13. The method of claim 11, further comprising:
    forming a contact layer below the wire on the encapsulant protrusion.

14. The method of claim 11, further comprising:
forming an insulation layer located between the substrate and the wire, the insulation layer having a contact through-hole at the connection point and leaving uncovered at least a portion of the trench; and
forming a contact layer below the wire on the encapsulant protrusion.

15. The method of claim 11, wherein the trench forming step includes cutting a starter trench and thereafter etching the starter trench to form the trench.

16. The method of claim 11, wherein the thinning step is patterned so as to leave a portion of the bottom surface of the substrate substantially co-planar with the wire on the encapsulant protrusion.

17. The method of claim 11, wherein the substrate is formed of material selected from the group consisting of silicon, gallium arsenide, silicon germanium, silicon carbide, gallium phosphide, ceramic materials, sapphire, and quartz.

18. The method of claim 11, wherein the electronic circuit is selected from the group consisting of an integrated circuit fabricated using the substrate, an electronic circuit fabricated using the substrate, an active discrete electronic component fabricated using the substrate, a passive discrete electronic component fabricated using the substrate, an integrated circuit attached to the substrate, an electronic circuit attached to the substrate, an active discrete electronic component attached to the substrate, and a passive discrete electronic component attached to the substrate.

19. The method of claim 11, wherein the wire is formed of material selected from the group consisting of gold, silver, nickel, nichrome-gold, nichrome-nickel, nickel-arsenic-gold, nickel-arsenic, nickel-gold, gold-tin-oxide, palladium-silicide, titanium, tungsten, titanium-tungsten, indium titanium oxide, aluminum, copper, platinum, alloys thereof, and layers thereof.

20. The method of claim 11, wherein the encapsulant is formed of material selected from the group consisting of epoxy, plastic, glass, polymide resin, Teflon, silicon oxide, silicon nitride, silicon, polysilicon, amorphous silicon, aluminum, diamond, and layers thereof.

21. The method of claim 13, wherein the contact layer is formed of material selected from the group consisting of gold, silver, nickel, nichrome-gold, nichrome-nickel, nickel-arsenic-gold, nickel-arsenic, nickel-gold, gold-tin-oxide, palladium-silicide, titanium, tungsten, titanium-tungsten, indium titanium oxide, aluminum, copper, platinum, alloys thereof, and layers thereof.

22. The method of claim 14, wherein the contact layer is formed of a material selected from the group consisting of gold, silver, nickel, nichrome-gold, nichrome-nickel, nickel-arsenic-gold, nickel-arsenic, nickel-gold, gold-tin-oxide, palladium-silicide, titanium, tungsten, titanium-tungsten, indium titanium oxide, aluminum, copper, platinum, alloys thereof, and layers thereof.

23. The method of claim 12, wherein the insulation layer is formed of material selected from the group consisting of silicon oxide, silicon nitride, aluminum oxide, polymide resins, epoxy, acrylics, patternable plastics, mixtures thereof, and layers thereof.

24. The method of claim 14, wherein the insulation layer is formed of material selected from the group consisting of silicon oxide, silicon nitride, aluminum oxide, polymide resins, epoxy, acrylics, patternable plastics, mixtures thereof, and layers thereof.

* * * * *